United States Patent
Yano et al.

(10) Patent No.: US 9,644,955 B2
(45) Date of Patent: May 9, 2017

(54) SCANNING ELECTRON BEAM DEVICE WITH FOCUS ADJUSTMENT BASED ON ACCELERATION VOLTAGE AND DIMENSION MEASUREMENT METHOD USING SAME

(71) Applicant: Hitachi High-Technologies Corporation, Minato-ku, Tokyo (JP)

(72) Inventors: Tasuku Yano, Tokyo (JP); Yasunari Sohda, Tokyo (JP); Muneyuki Fukuda, Tokyo (JP); Katsunori Onuki, Tokyo (JP); Hajime Kawano, Tokyo (JP); Naomasa Suzuki, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 244 days.

(21) Appl. No.: 14/364,392

(22) PCT Filed: Nov. 26, 2012

(86) PCT No.: PCT/JP2012/080509
§ 371 (c)(1),
(2) Date: Jun. 11, 2014

(87) PCT Pub. No.: WO2013/088944
PCT Pub. Date: Jun. 20, 2013

(65) Prior Publication Data
US 2014/0339425 A1    Nov. 20, 2014

(30) Foreign Application Priority Data
Dec. 13, 2011  (JP) .................. 2011-271863

(51) Int. Cl.
*H01J 37/28* (2006.01)
*G01B 15/00* (2006.01)
(Continued)

(52) U.S. Cl.
CPC .............. *G01B 15/00* (2013.01); *H01J 37/21* (2013.01); *H01J 37/28* (2013.01); *H01L 22/12* (2013.01);
(Continued)

(58) Field of Classification Search
CPC ..... G01B 15/00; G01B 2210/56; H01L 22/12; H01J 37/28; H01J 37/21; H01J 37/244; H01J 2237/20; H01J 2237/281
See application file for complete search history.

(56) References Cited

U.S. PATENT DOCUMENTS 5,594,245 A * 1/1997 Todokoro ............... G01B 15/00
                                                    250/307
6,521,891 B1  2/2003 Dotan et al.
(Continued)

FOREIGN PATENT DOCUMENTS

| JP | 11-135052 A   | 5/1999 |
| JP | 2001-236915 A | 8/2001 |
| JP | 2008-151797 A | 7/2008 |

OTHER PUBLICATIONS

Tanaka, H., et al., "Bit-Cost Scalable Technology for Low-Cost and Ultrahigh-Density Flash Memory", Toshiba Review, vol. 63, 28 (2008).
(Continued)

*Primary Examiner* — Brooke Purinton
(74) *Attorney, Agent, or Firm* — Miles & Stockbridge P.C.

(57) ABSTRACT

A scanning electron beam device having: a deflector (5) for deflecting an electron beam (17) emitted from an electron source (1); an objective lens (7) for causing the electron beam to converge; a retarding electrode; a stage (9) for placing a wafer (16); and a controller (15); wherein the stage can be raised and lowered. In the low acceleration voltage region, the controller performs rough adjustment and fine adjustment of the focus in relation to the variation in the height of the wafer using electromagnetic focusing performed through excitation current adjustment of the objective lens. In the high acceleration voltage region, the controller performs rough adjustment of the focus in relation to
(Continued)

the variation in the height of the wafer by mechanical focusing performed through raising and lowering of the stage, and performs fine adjustment by electrostatic focusing performed through adjustment of the retarding voltage. It thereby becomes possible to provide a scanning electron beam device that measures, in a highly accurate manner, both the upper part and the bottom part of a groove or a hole having a high aspect ratio.

12 Claims, 23 Drawing Sheets

(51) Int. Cl.
*H01J 37/21* (2006.01)
*H01L 21/66* (2006.01)
*H01J 37/244* (2006.01)

(52) U.S. Cl.
CPC ......... *G01B 2210/56* (2013.01); *H01J 37/244* (2013.01); *H01J 2237/20* (2013.01); *H01J 2237/281* (2013.01)

(56) References Cited

U.S. PATENT DOCUMENTS

| | | |
|---|---|---|
| 6,653,634 B1 | 11/2003 | Otaka et al. |
| 2002/0026808 A1* | 3/2002 | Chia ................. A44C 11/007 63/26 |
| 2002/0056808 A1* | 5/2002 | Tsuneta ................. H01J 37/21 250/306 |
| 2006/0038125 A1* | 2/2006 | Tsuneta ................. G01N 23/22 250/310 |
| 2008/0203298 A1* | 8/2008 | Ishijima ............... G01N 23/225 250/307 |
| 2009/0140143 A1* | 6/2009 | Fukuda ................ H01J 37/026 250/311 |

OTHER PUBLICATIONS

Kim, J., et al., "Novel Vertical-Stacked-Array-Transistor (VSAT) for ultra-high-density and cost-effective NAND Flash memory devices and SSD (Solid State Drive)", VLSI Tech. Dig., 186 (2009).
Hisamoto, D., et al., "Impact of the Vertical SOI "Delta" Structure on Planar Device Technology", IEEE Transactions on Electron Devices, 38, 1419 (1991).

* cited by examiner

F I G . 1 4

| ACCELERATION VOLTAGE | INITIAL ACCELERATION VOLTAGE | RETARDING VOLTAGE | WD | EXCITATION CURRENT | EXCITATION-CURRENT CORRECTION | | | | RETARDING VOLTAGE CORRECTION | | | | DEFLECTION SENSITIVITY | | | | | TOLERANCE FOR WAFER HEIGHT |
|---|---|---|---|---|---|---|---|---|---|---|---|---|---|---|---|---|---|---|
| | | | | | +100 μm | +50 μm | -50 μm | -100 μm | +100 μm | +50 μm | -50 μm | -100 μm | +100 μm | +50 μm | 0 μm | -50 μm | -100 μm | |
| V | V | V | mm | AT | AT | | | | V | | | | μm/AT | | | | | μm |
| 300 | 3000 | 2700 | 3.0 | 939.4 | 15.5 | 7.8 | -7.9 | -15.8 | - | - | - | - | 5.97 | 5.87 | 5.77 | 5.68 | 5.59 | 100 |
| 500 | 3000 | 2500 | 3.0 | 992.3 | 16.4 | 8.2 | -8.3 | -16.7 | - | - | - | - | 7.71 | 7.58 | 7.45 | 7.33 | 7.21 | 100 |
| 800 | 3000 | 2200 | 3.0 | 1052.9 | 17.4 | 8.7 | -8.8 | -17.7 | - | - | - | - | 9.75 | 9.59 | 9.43 | 9.27 | 9.12 | 100 |
| 1200 | 3000 | 1800 | 3.0 | 1115.8 | 18.4 | 9.3 | -9.3 | -18.8 | - | - | - | - | 11.95 | 11.74 | 11.55 | 11.36 | 11.17 | 100 |
| 1800 | 3000 | 1200 | 3.0 | 1189.8 | 19.7 | 9.9 | -10.0 | -20.0 | - | - | - | - | 14.63 | 14.38 | 14.14 | 13.91 | 13.69 | 100 |
| 3000 | 3000 | 100 | 3.0 | 1300.0 | 21.5 | 10.8 | -10.9 | -21.8 | - | - | - | - | 18.89 | 18.57 | 18.26 | 17.96 | 17.67 | 100 |
| 5000 | 5000 | 100 | 3.0 | 1678.0 | 27.7 | 13.9 | -14.0 | -28.2 | - | - | - | - | 24.38 | 23.97 | 23.57 | 23.18 | 22.81 | 100 |
| 10000 | 10000 | 100 | 3.0 | 2373.0 | - | - | - | - | 333.3 | 166.7 | -166.7 | -333.3 | 34.48 | 33.90 | 33.33 | 32.79 | 32.26 | 10 |
| 15000 | 15000 | 100 | 3.0 | 2906.0 | - | - | - | - | 500.0 | 250.0 | -250.0 | -500.0 | 42.23 | 41.52 | 40.82 | 40.16 | 39.51 | 10 |
| 20000 | 20000 | 100 | 3.4 | 3000.0 | - | - | - | - | 588.2 | 294.1 | -294.1 | -588.2 | 42.85 | 42.22 | 41.59 | 40.99 | 40.41 | 10 |
| 30000 | 30000 | 100 | 4.3 | 3000.0 | - | - | - | - | 697.7 | 348.8 | -348.8 | -697.7 | 41.24 | 40.75 | 40.28 | 39.82 | 39.36 | 10 |

FIG. 15

| ACCELERATION VOLTAGE | | V | 800 | 30000 |
|---|---|---|---|---|
| INITIAL ACCELERATION VOLTAGE | | V | 3000 | 30000 |
| RETARDING VOLTAGE | | V | 2200 | 100 |
| WD | | mm | 3 | 4.3 |
| EXCITATION CURRENT | | AT | 1052.898 | 3000 |
| EXCITATION-CURRENT CORRECTION | +100 μm | AT | 17.40445 | - |
| | +50 μm | | 8.737893 | - |
| | -50 μm | | -8.81102 | - |
| | -100 μm | | -17.697 | - |
| RETARDING VOLTAGE CORRECTION | +100 μm | V | - | 697.6744 |
| | +50 μm | | - | 348.8372 |
| | -50 μm | | - | -348.837 |
| | -100 μm | | - | -697.674 |
| DEFLECTION SENSITIVITY | +100 μm | μm/AT | 9.753197 | 41.2393 |
| | +50 μm | | 9.587889 | 40.75414 |
| | 0 μm | | 9.42809 | 40.28025 |
| | -50 μm | | 9.273532 | 39.81726 |
| | -100 μm | | 9.123958 | 39.36479 |
| TOLERANCE FOR WAFER HEIGHT | | μm | 100 | 10 |

FIG. 16

WD WILL BE CHANGED WHEN THIS RECIPE IS EXECUTED

| OK | | CANCEL |

SCANNING ELECTRON BEAM DEVICE WITH FOCUS ADJUSTMENT BASED ON ACCELERATION VOLTAGE AND DIMENSION MEASUREMENT METHOD USING SAME

TECHNICAL FIELD

The present invention relates to a scanning electron beam device that measures the dimensions of a fine pattern on a semiconductor wafer and a dimension measurement method using the scanning electron beam device. In particular, the present invention relates to a scanning electron beam device that measures the dimensions of holes and grooves having high aspect ratios.

BACKGROUND ART

The present invention relates to a device for automatically measuring deep holes and deep grooves on a wafer during fabrication of a semiconductor device. First, the fact that deep holes and deep grooves are increased in a semiconductor-device fabrication process will be described, and then, automatic measurement devices for semiconductor devices will be described.

In recent years, the importance of dimension measurement of the bottoms of holes and grooves having high aspect ratios is increased in the semiconductor device fabrication process. For example, Non-Patent Literatures 1 and 2 describe methods in which a number of conductive films and insulating films are stacked on each other and are collectively subjected to etching, in order to reduce the cost of lithography for flash memories, and the aspect ratios of holes and grooves are 30 or larger in the process of fabrication of such configurations. Furthermore, Non-Patent Literature 3 describes a configuration in which a region between a source and a drain of a transistor, that is, an active region, is surrounded by a gate wire, and the aspect ratios of holes and grooves are also 30 or larger in the process of fabrication of this configuration.

In semiconductor-device mass-production factories, in order to manage the semiconductor-device fabrication process, the dimensions of tops and bottoms of holes and grooves are measured. This dimension measurement can be performed using a scanning electron microscope (SEM). In the SEM, electrons emitted from an electron source are accelerated, are converged by an objective lens to which an excitation current is applied, and are radiated onto the surface of a wafer. The stream of the electrons is called an electron beam. Through the irradiation of the electron beam, secondary electrons are generated from the wafer. When the electron beam is scanned on the wafer surface through electromagnetic deflection to obtain the secondary-electron signal strength, an electron microscope image (SEM image) reflecting the shape of the wafer is acquired. The dimensions of a pattern on the wafer are determined from this SEM image and the magnification of the image.

In a scanning electron beam device for automatically measuring the dimensions of a pattern on a wafer using an electron beam, the stage on which the wafer is loaded is horizontally moved, and the electron beam is radiated onto a predetermined measurement point, thereby measuring the dimensions of the pattern. Because of a warp of the wafer or a tilt of the stage, when the stage is horizontally moved, the height of the wafer varies. The variation in the height of the wafer causes out-of-focus, that is, image blurring, thus worsening the precision of pattern dimension measurement.

Therefore, as disclosed in Patent Literature 1, the working distance (WD) or the strength of an electromagnetic lens or an electrostatic lens is changed to achieve the in-focus state. A description thereof will be given below in more detail. If focusing is performed based on a SEM image acquired by radiating the electron beam onto the wafer, image blurring is solved, but the amount of electrons to be radiated is increased, thereby causing problems of electrostatic charge, contamination, and resist shrinkage of the wafer. In order to avoid these problems caused by the electron-beam irradiation, the length of time of the electron-beam irradiation for focusing needs to be reduced; for this purpose, before the focusing based on a SEM image, it is necessary to measure the height of the wafer using a height sensor and to perform rough focus adjustment, in advance. The rough focus adjustment is performed through electromagnetic focusing that is performed by adjusting an excitation current for the objective lens. In order to adjust the excitation current according to the height of the wafer, it is desired that the reciprocal of the focal distance, that is, the lens strength, be always proportional to the excitation current.

CITATION LIST

Patent Literature

Patent Literature 1: Japanese Patent Application Laid-Open No. 2001-236915

Non Patent Literature

Non-Patent Literature 1: Tanaka and two others, "Low-bit-cost and ultrahigh-density NAND-type flash memory of three-dimensional structure", Toshiba review Vol. 63, 28 (2008)

Non-Patent Literature 2: J. Kim and nine others, "Novel Vertical-Stacked-Array-Transistor (VSAT) for ultra-high-density and cost-effective NAND Flash memory devices and SSD (Solid State Drive)", VLSI Tech. Dig., 186 (2009)

Non-Patent Literature 3: Digh Hisamoto, "Impact of the Vertical SOI DELTA' Structure on Planar Device Technology", IEEE TRANSACTIONS ON ELECTRON DEVICES, 38, 1419 (1991)

SUMMARY OF INVENTION

Technical Problem

A problem to be solved by the present invention is to measure, when semiconductors including deep holes and deep grooves of aspect ratios of 30 or larger are mass-produced, the dimensions of both upper portions and bottom portions, that is, tops and bottoms, of the holes and the grooves, for the purpose of managing the mass production process. The tops can be measured with a low-acceleration electron beam; however, in order to measure the bottoms of such holes and grooves having aspect ratios of 30, it is necessary to radiate a high-acceleration electron beam and to detect reflection electrons generated at the bottom portions. If the acceleration voltage is increased in order to measure the bottoms, however, three new small problems occur.

If the acceleration voltage is increased in order to measure the bottoms, it is difficult to converge the electron beam. In order to converge a high-acceleration electron beam, there are two methods: a first method is to extend a working distance (WD); and a second method is to increase an excitation current for the objective lens.

If the first method is used, that is, if the WD is extended, since the levels of the chromatic aberration and the spherical aberration are increased at a low acceleration voltage, the resolution deteriorates, and the precision of pattern dimension measurement also becomes worse.

If the second method is used, that is, if the excitation current is increased, two impediments are posed.

A first impediment is to increase the influence of hysteresis, that is, magnetic history, on the magnetic field strength. In this case, the lens strength is also influenced by the history, and, even though the excitation current is found, the lens strength is not found. If the lens strength is not found, the magnification of an image cannot be determined, thereby making the pattern dimension measurement impossible. Note that this impediment can be avoided if the objective lens is demagnetized every time the excitation current is changed; however, when the acceleration voltage is large, and the hysteresis is strong, the magnetization requires a long time, which significantly reduces automatic-dimension-measurement throughput.

A second impediment is that, if the excitation current is increased, a magnetic path of the objective lens is magnetically saturated, thus making it impossible to increase the lens strength. In this case, convergence of an electron beam is impossible, which also makes the pattern dimension measurement impossible.

To summarize the above description, in order to achieve both dimension measurement of the tops at a low acceleration voltage and dimension measurement of the bottoms at a high acceleration voltage, the following three small problems are posed. A first small problem is deterioration of the resolution at a low acceleration voltage, a second small problem is that the magnification cannot be determined due to the hysteresis of the objective lens at a high acceleration voltage, and a third small problem is that the electron beam cannot be converged due to magnetic saturation of the objective lens at a high acceleration voltage. In other words, in order to converge an electron beam in dimension measurement of both the tops and the bottoms of deep holes and deep grooves having aspect ratios of 30 or larger, if the method disclosed in Patent Literature 1 is used, that is, if the WD or the strength of an electromagnetic lens or an electrostatic lens is changed, at least one of the following three small problems is posed: deterioration of the resolution; inability to determine the magnification; and inability to converge an electron beam due to magnetic saturation of the objective lens.

An object of the present invention is to provide a scanning electron beam device that measures, with high precision, the dimensions of both upper portions and bottom portions of holes or grooves having high aspect ratios.

Solution to Problem

In the present invention, the stage can be raised/lowered, an appropriate height of the stage is selected according to the acceleration voltage, and the stage, which can be raised/lowered, is used as a rough focus adjustment means for the variation in the height of the wafer, thereby solving the three small problems and making it possible to measure the dimensions of both the tops and the bottoms of deep holes and deep grooves having aspect ratios of 30 or larger.

Methods for solving the three small problems will be described step by step. The first small problem is solved by shortening the WD at the time of a low acceleration voltage. Specifically, by shortening the WD at the time of a low acceleration voltage, the levels of the chromatic aberration and the spherical aberration are reduced, thus preventing deterioration of the resolution at a low acceleration voltage. The second small problem, that is, inability to determine the magnification due to the hysteresis of the objective lens at a high acceleration voltage, is solved by using WD adjustment that is performed by raising/lowering the stage, as a rough focus adjustment means for the height variation. The solution to the second small problem will be described in more detail. When WD adjustment that is performed by raising/lowering the stage is used as a rough focus adjustment means for the height variation, it is unnecessary to change the excitation current for rough focus adjustment responding to the height variation. Thus, the number of times the excitation current for the objective lens is changed is dramatically reduced, and, even when the objective lens is demagnetized every time the excitation current is changed, the dimension-measurement throughput is not significantly worsened. If the excitation current is changed, including demagnetization, and if the excitation current is not changed after that, the lens strength and the magnification are constant. If the magnification is constant, magnification control can be performed. The third small problem, that is, inability to converge an electron beam due to magnetic saturation of the objective lens at a high acceleration voltage, is solved by extending the WD at the time of high acceleration and converging the electron beam using a low excitation current that does not cause magnetic saturation.

The above-described solutions to the three small problems allow convergence of the electron beam, rough focus adjustment for the wafer height, and magnification control, at a wide range of acceleration voltages, thereby achieving a larger problem, that is, dimension measurement of the tops with a low-acceleration electron beam and dimension measurement of the bottom with a high-acceleration electron beam.

According to a first aspect, the present invention provides a scanning electron beam device that includes an electron source, a deflector for deflecting an electron beam emitted from the electron source, an objective lens for converging the electron beam, a retarding electrode, a stage on which a wafer is loaded, and a controller, and that acquires a SEM image of the wafer by radiating the electron beam onto the wafer and detecting secondary electrons generated from the wafer, in which the stage or the objective lens can be raised/lowered; and the controller performs rough focus adjustment responding to a variation in height of the wafer, through mechanical focusing that is performed by raising/lowering the stage or the objective lens.

Furthermore, in the above-described scanning electron beam device of the present invention, in a low-acceleration-voltage region of an acceleration voltage for the electron beam, the controller performs rough focus adjustment and precise focus adjustment responding to the variation in the height of the wafer, through electromagnetic focusing that is performed by adjusting an excitation current for the objective lens; and, in a high-acceleration-voltage region, the controller performs rough focus adjustment responding to the variation in the height of the wafer, through mechanical focusing that is performed by raising/lowering the stage or the objective lens, and performs precise focus adjustment through electrostatic focusing that is performed by adjusting a retarding voltage applied to the retarding electrode, through electrostatic focusing that is performed by adjusting a boosting voltage applied to a boosting electrode, or through electrostatic focusing that is performed by adjusting an initial acceleration voltage for the electron source.

According to a second aspect, the present invention provides a dimension measurement method using a scanning electron beam device that includes an electron source, a deflector for deflecting an electron beam emitted from the electron source, an objective lens for converging the electron beam, a retarding electrode, a stage on which a wafer is loaded, and a controller, and that acquires a SEM image of the wafer by radiating the electron beam onto the wafer and detecting secondary electrons generated from the wafer, the method including the steps of: in order to acquire SEM images while changing an acceleration voltage, acquiring, when a low-acceleration electron beam is used to measure upper portions of a hole and a groove on the wafer, an image after shortening a working distance (WD) indicated by the distance between a surface of the wafer and a lower end of the objective lens; acquiring, when a high-acceleration electron beam is used to measure bottom portions of the hole and the groove on the wafer, an image after performing rough focus adjustment responding to a variation in the height of the wafer, through mechanical focusing for adjusting the working distance (WD) by raising/lowering the stage or the objective lens; and measuring dimensions of the upper portions and the bottom portions of the hole and the groove on the wafer, from the acquired images.

Advantageous Effects of Invention

According to the present invention, it is possible to perform dimension measurement of the tops and the bottoms of holes and grooves having high aspect ratios, thereby facilitating management of mass-production of semiconductor wafers.

BRIEF DESCRIPTION OF DRAWINGS

FIG. 14 is a view showing a screen for displaying and revising parameters.
FIG. 15 is a view showing a parameter display screen to be displayed when a recipe is created.
FIG. 16 is a view showing a warning to be displayed when a recipe causing a WD change is created and when the recipe is executed.

DESCRIPTION OF EMBODIMENT

Figure 1:
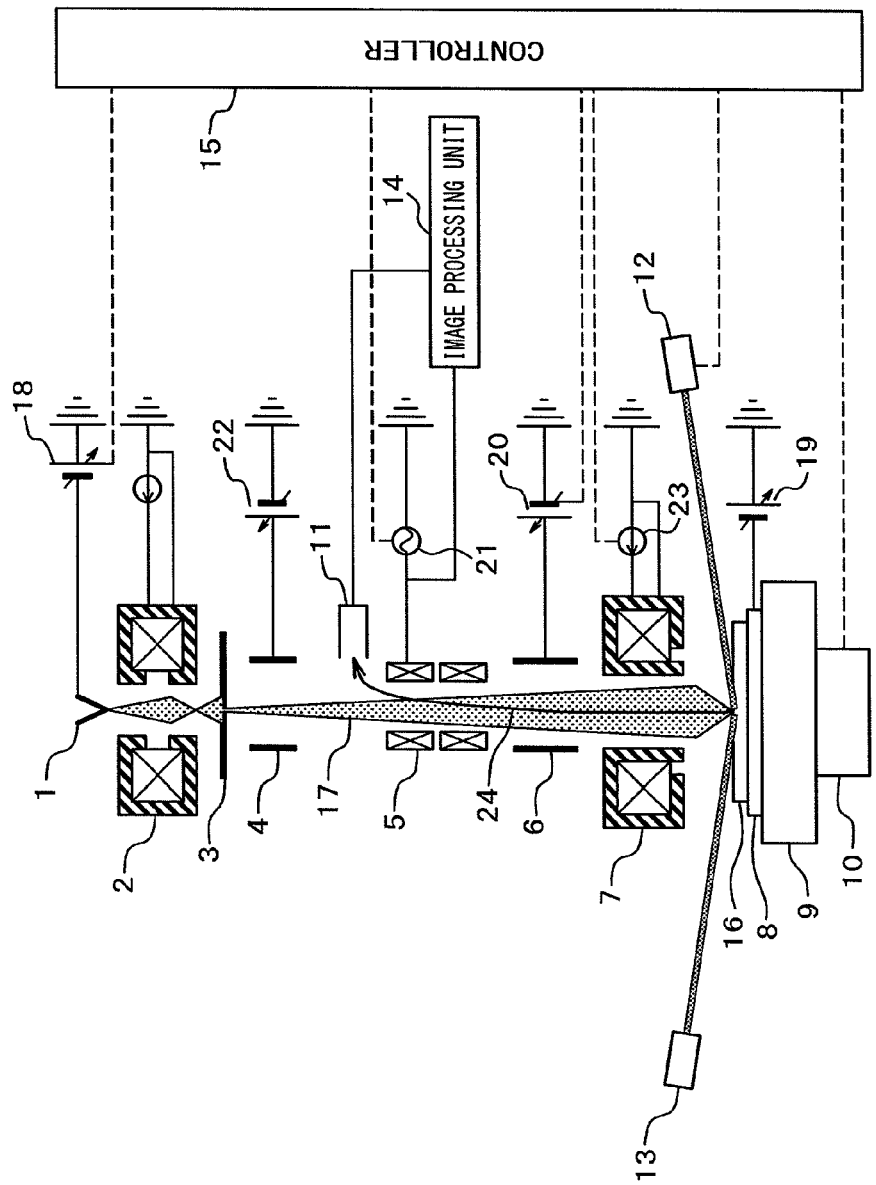
FIG. 1 is a view showing the configuration of a device according to Embodiment 1 of the present invention.

An embodiment of the present invention will be described in detail below with reference to the drawings. Note that, in all the drawings for explaining the embodiment, identical reference numerals are assigned to parts having identical functions, and a repeated description thereof will be omitted.

First Embodiment

The configuration of a device according to Embodiment 1 to which the present invention is applied and the actions of parts of the device will be described with reference to FIG. 1.

As shown in FIG. 1, a scanning electron beam device of Embodiment 1 includes an electron source 1, a condenser lens 2, an aperture 3, a blanking electrode 4, a deflector 5, a boosting electrode 6, an objective lens 7, a retarding electrode 8, a stage 9, a stage lift 10, a secondary-electron detector 11, a wafer height sensor 12, a light source 13, an image processing unit 14, and a controller 15, and is used with a wafer 16 loaded on the stage 9.

An electron beam 17 emitted from the electron source 1 is converged by the condenser lens 2, is partially transmitted through the aperture 3, passes through the blanking electrode 4, the deflector 5, the boosting electrode 6, and the objective lens 7, and is then radiated onto the wafer 16.

While traveling from the electron source 1 to the wafer 16, the electron beam 17 is subjected to acceleration and deceleration due to voltages applied to the electrodes. Reference numerals of the voltages applied to the electrodes and acceleration and deceleration of the electron beam will be described below.

A negative voltage is applied to the electron source 1, a positive voltage is applied to the boosting electrode 6, and a negative voltage is applied to the retarding electrode 8. In the present invention, absolute values are used to express the values of a voltage applied to the electron source 1, that is, an initial acceleration voltage 18, and a voltage applied to the retarding electrode, that is, a retarding voltage 19. For example, when the retarding voltage is 1 kV, this means that −1 kV is applied to the retarding electrode. Note that, because a positive voltage is applied to the boosting electrode 6, a voltage to be applied to the boosting electrode 6 is deemed to be positive.

While traveling from the electron source 1 to the wafer 16, the electron beam 17 is subjected to acceleration due to the initial acceleration voltage 18, acceleration and deceleration due to a boosting voltage 20, and deceleration due to the retarding voltage 19. Here, because acceleration and deceleration due to the boosting voltage 20 cancel each other out, the sum of acceleration due to the initial acceleration voltage 18 and deceleration due to the retarding voltage 19 forms the net acceleration voltage. In the following description, the difference between the initial acceleration voltage 18 and the retarding voltage 19 is called an acceleration voltage.

Although the voltages and currents applied to the parts have been described so far, a voltage applied to the electron source 1, that is, the initial acceleration voltage 18, a current applied to the condenser lens 2, a voltage 22 applied to the blanking electrode 4, a voltage applied to the boosting electrode 6, that is, the boosting voltage 20, a current applied to the objective lens 7, that is, an excitation current 23, a voltage applied to the retarding electrode 8, that is, the retarding voltage 19, are variable. Furthermore, the stage 9 is provided with the stage lift 10 and can be raised/lowered, and the distance from a lower end of the objective lens 7 to a surface of the wafer 16, that is, the WD, is variable.

Functions of the blanking electrode 4 and the deflector 5 will be described.

The blanking electrode 4 makes the electron beam 17 bend when a voltage is applied to the blanking electrode 4, and stops irradiation of the electron beam when the irradiation is unnecessary. The voltage applied thereto can be positive or negative. By stopping irradiation of the electron beam when the irradiation is unnecessary, it is possible to reduce the levels of electrostatic charge, contamination, and shrinkage of the wafer 16, which are caused by irradiation of the electron beam. Note that the blanking electrode 4 can be replaced with a configuration in which a current is applied to a coil, and the electron beam is bent by a thus-produced magnetic field.

When passing through the deflector 5, the electron beam 17 is bent by a magnetic field produced by the deflector 5 and is radiated onto a predetermined position of the wafer 16. Here, a current applied to the deflector 5 is called a deflection signal 21. Note that the electromagnetic deflection performed by applying a current to the deflector 5 has been described here; however, electrostatic deflection performed by applying a voltage may be used.

When passing through the objective lens 7, the electron beam 17 is subjected to the action of convergence due to the magnetic field and is converged onto the surface of the wafer 16.

When the electron beam 17 is radiated onto the wafer 16, secondary electrons 24 are emitted from the wafer 16. The secondary electrons 24 are accelerated by the retarding voltage 19 and the boosting voltage 20 and are detected by the secondary-electron detector 11. The secondary-electron detector 11 generates a signal according to the amount of the detected secondary electrons, and this signal is sent to the image processing unit 14. The image processing unit 14 forms a SEM image by associating the deflection signal 21 with the secondary-electron signal.

The wafer height sensor 12 measures the height of the wafer 16 by accepting light emitted from the light source 13 and reflected on the wafer 16. A thick line in the figure denotes a light path.

The respective parts, from the electron source 1 to the image processing unit 14, of the device according to Embodiment 1 are comprehensively controlled by the controller 15. In particular, the initial acceleration voltage 18, the boosting voltage 20, the retarding voltage 19, the excitation current 23 for the objective lens 7, and the wafer height adjusted by the stage lift 10 and measured by the wafer height sensor 12 are comprehensively controlled according to the acceleration voltage, which is a feature of the present invention. These control relationships, which show the feature of the present invention, are indicated by dashed lines in the figure.

This is the end of the description of the configuration of the device and the actions of the parts.

Figure 2:
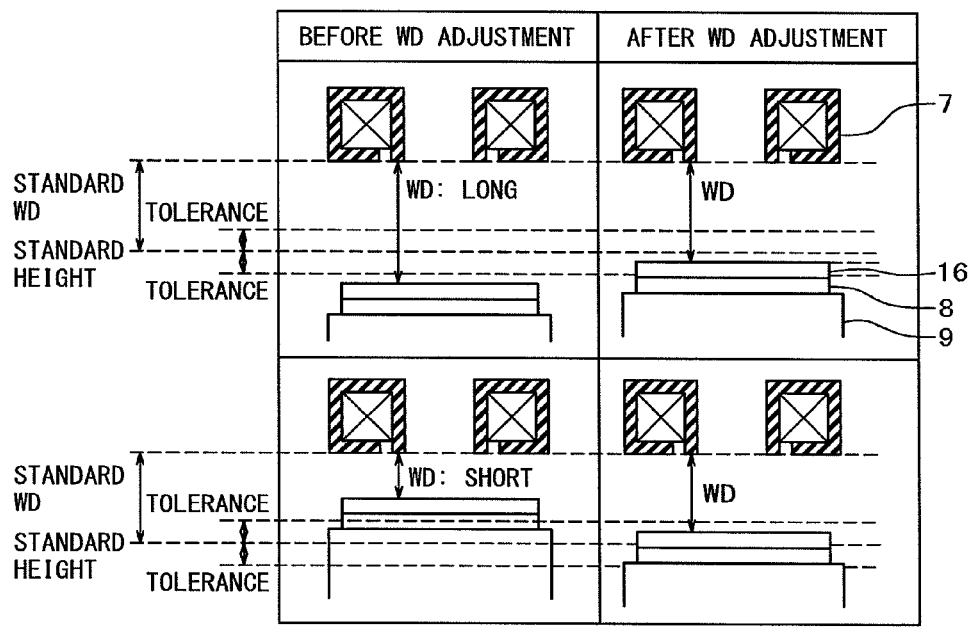
FIG. 2 is a view for explaining WD adjustment that is performed by raising/lowering a stage.

FIG. 2 is a view for explaining WD adjustment performed by raising/lowering the stage. In this adjustment, a standard WD and a tolerance for a real WD are determined in advance, and the difference between the real WD and the standard WD, that is, a WD error, is made smaller than the WD tolerance, in other words, the WD is made to fall within an acceptance range. An upper part of this figure shows a case in which, when the wafer 16 is too low in height, that is, when the WD is too long, the WD is made to fall within the acceptance range by raising the stage. Furthermore, a lower part in this figure shows a case in which, when the wafer 16 is too high in height, that is, when the WD is too short, the WD is made to fall within the acceptance range by lowering the stage. Note that, because the wafer is fixed to the stage, when the stage is moved, the wafer is also moved. The real height of the wafer 16 is measured by the wafer height sensor 12.

The fact that changing the height of the wafer 16 is equivalent to changing the WD is supplementally mentioned. Specifically, when the wafer 16 is raised, the WD is shortened, and, when the wafer 16 is lowered, the WD is lengthened. Therefore, the height of the wafer 16 obtained when the WD becomes the standard WD is called a standard height, and the WD tolerance can be replaced with the height tolerance.

Figure 3:
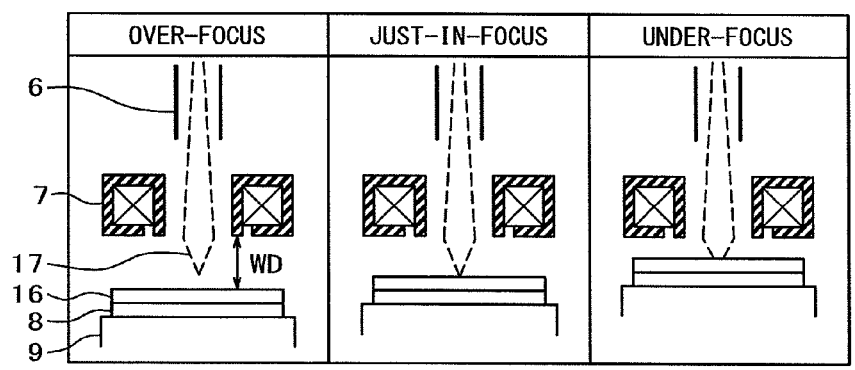
FIG. 3 is a view for explaining mechanical focusing that is performed by raising/lowering the stage.

FIG. 3 is a view for explaining mechanical focusing that uses WD adjustment performed by raising/lowering the stage. This figure shows, in order from the left side, an over-focus state, a just-in-focus state, and an under-focus state, and the WD is gradually shortened. In the over-focus state, the electron beam 17 is converged above the wafer 16. In the just-in-focus state, the electron beam 17 is converged on the surface of the wafer 16. In the under-focus state, the electron beam 17 has not yet been converged on the surface of the wafer 16. Note that the boosting electrode 6 is shown in this figure in order to make it clear that which of the stage 9 and the objective lens 7 is moved, and the boosting electrode 6 does not have a role in the function of the mechanical focusing. Furthermore, because the wafer 16 is fixed to the stage 9, when the stage 9 is moved, the wafer 16 is also moved.

In the mechanical focusing that is performed by raising/lowering the stage 9, shown in this figure, the stage 9 is raised in the over-focus state and is lowered in the under-focus state, thereby adjusting the WD and achieving the just-in-focus state.

Electromagnetic focusing and electrostatic focusing will be described generally with reference to FIG. 4 and in more detail with reference to FIGS. 5 and 6.

Figure 4:
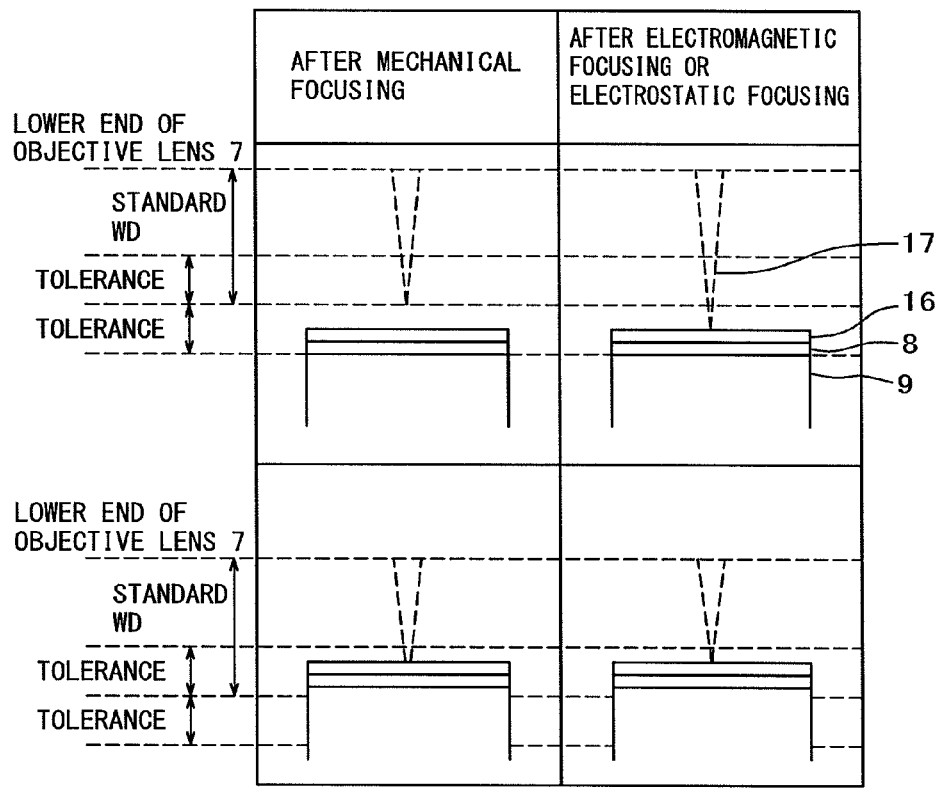
FIG. 4 is a view for explaining electromagnetic focusing and electrostatic focusing.

FIG. 4 is a view for generally explaining electromagnetic focusing and electrostatic focusing. After WD adjustment, even though the WD falls within the acceptance range, the height at which the electron beam 17 is converged, that is, the focus height, and the height of the wafer 16 do not agree. Thus, the focus height and the height of the wafer 16 are made to agree through electromagnetic focusing and electrostatic focusing. The reason why electromagnetic focusing and electrostatic focusing are performed after WD adjustment in this way is because it is difficult to improve the precision of WD adjustment through mechanical movement.

Figure 5:
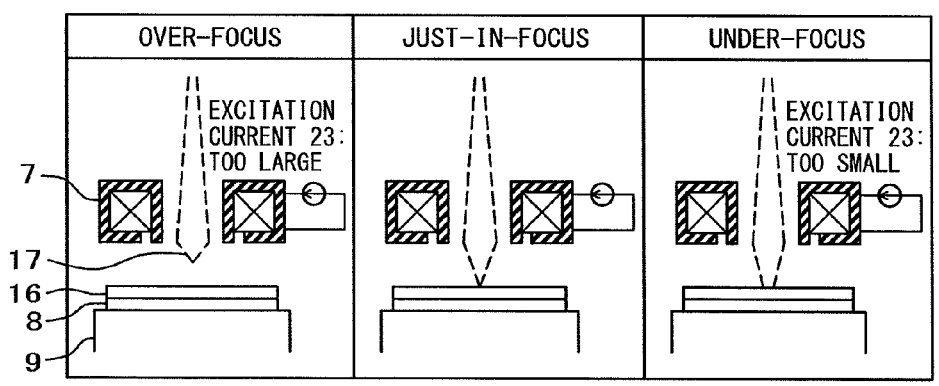
FIG. 5 is a view for explaining electromagnetic focusing that is performed by adjusting an excitation current for an objective lens.

FIG. 5 is a view for explaining electromagnetic focusing that is performed by adjusting the excitation current 23 for the objective lens and shows, in order from the left side, an over-focus state, a just-in-focus state, and an under-focus state. Because the excitation current 23 for the objective lens 7 is too high in the over-focus state, the excitation current 23 is reduced, and, because the excitation current 23 for the objective lens 7 is too low in the under-focus state, the excitation current 23 is increased, thereby adjusting the strength of the objective lens and achieving the just-in-focus state.

Figure 6:
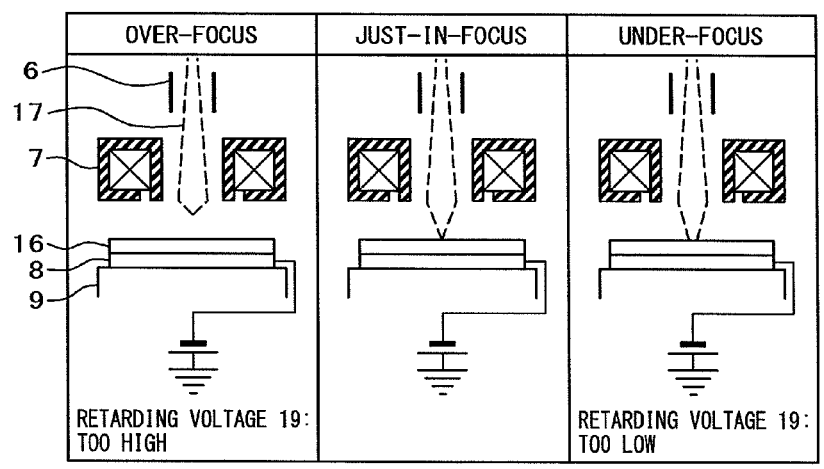
FIG. 6 is a view for explaining electrostatic focusing that is performed by adjusting a retarding voltage.

FIG. 6 is a view for explaining electrostatic focusing that is performed by adjusting the retarding voltage 19. In the electrostatic focusing that is performed by adjusting the retarding voltage 19, the retarding voltage 19 is reduced because it is too high in the over-focus state, and the retarding voltage 19 is increased because it is too low in the under-focus state, thereby achieving the just-in-focus state.

Figure 7:
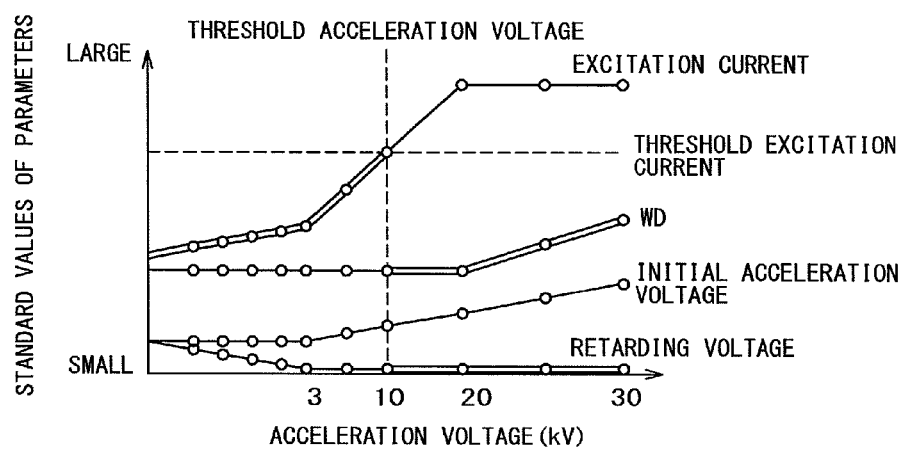
FIG. 7 is a view for explaining the relationships among standard values of the excitation current, a WD, an initial acceleration voltage, and the retarding voltage with respect to an acceleration voltage.

FIG. 7 shows standard values of the initial acceleration voltage 18, the retarding voltage 19, the excitation current 23, and the WD, with respect to the acceleration voltage. In the present invention, focusing means for the variation in the height of the wafer 16 is classified into two steps, i.e., rough adjustment and precise adjustment. Double-lined portions are used as means for one or both of rough focus adjustment and precise focus adjustment responding to the variation in the height of the wafer 16. Furthermore, the device of the present invention stores the standard values of the initial acceleration voltage, the retarding voltage, the excitation current, and the wafer height, with respect to acceleration voltages shown in FIG. 7, and is used only at acceleration voltages that are marked with circles. Note that the device may be used at voltages that are not marked with circles, by interpolating the values between the circles, or may use approximate equations generated as functions of the acceleration voltage. However, when interpolation is performed or such approximate equations are used, if the precision thereof is low, the precision of dimension measurement eventually becomes low. Note that acceleration voltages of 3 kV, 10 kV, 20 kV, and 30 kV used in this description are merely examples and do not numerically limit the scope of the invention.

FIG. 7 is used to describe below that the method of setting the initial acceleration voltage 18 and the retarding voltage 19 and the method for rough focus adjustment and precise focus adjustment are changed according to the acceleration voltage.

When the acceleration voltage is 3 kV or lower, in order to reduce the chromatic aberration and improve the resolution, the initial acceleration voltage is set to 3 kV, and the acceleration voltage is adjusted by the retarding voltage 19. Because the electromagnetic focusing, which is performed by adjusting the excitation current 23 for the objective lens 7, can deal with a large height variation and a small height variation, the electromagnetic focusing is used for both rough focus adjustment and precise focus adjustment responding to the variation in the height of the wafer 16.

When the acceleration voltage exceeds 3 kV, because the chromatic aberration is reduced, the retarding voltage 19 does not have a role of improving the resolution any longer. The retarding voltage 19 merely plays a role in improvement of secondary-electron detection efficiency and offset of electrostatic focusing and is reduced. Because the electromagnetic focusing, which is performed by adjusting the excitation current 23 for the objective lens 7, can deal with a large height variation and a small height variation, the electromagnetic focusing is used for both rough focus adjustment and precise focus adjustment responding to the variation in the height of the wafer 16.

When the acceleration voltage exceeds 10 kV, the excitation current 23 is increased, and the hysteresis is increased. Therefore, the electromagnetic focusing, which is performed by adjusting the excitation current 23 for the objective lens 7, cannot be used, and the mechanical focusing for adjusting the WD by raising/lowering the stage 9 is used for rough focus adjustment responding to the variation in the height of the wafer 16. Furthermore, the electrostatic focusing that is performed by adjusting the retarding voltage 19 is used for precise focus adjustment responding to the variation in the height of the wafer 16.

When the acceleration voltage exceeds 20 kV, even if the excitation current 23 for the objective lens 7 is increased, the lens strength of the objective lens 7 is not increased due to magnetic saturation. Thus, as the acceleration voltage is increased, the stage 9 is lowered, thus extending the WD. When the acceleration voltage is 20 kV or more, the electromagnetic focusing, which is performed by adjusting the excitation current 23 for the objective lens 7, cannot be used, and the mechanical focusing for adjusting the WD by raising/lowering the stage 9 is used for rough focus adjustment responding to the variation in the height of the wafer 16. Furthermore, the electrostatic focusing that is performed by adjusting the retarding voltage 19 is used for precise focus adjustment responding to the variation in the height of the wafer 16.

The fact that the method of setting the initial acceleration voltage 18 and the retarding voltage 19 and the method for rough focus adjustment and precise focus adjustment are changed according to the acceleration voltage has been described so far. The above-described focusing methods will be classified, and the relationship between the acceleration voltage and the focusing methods will be summarized below.

The focusing methods are classified, in terms of precision, into three types, i.e., rough adjustment and precise adjustment responding to the variation in the height of the wafer 16 and fine adjustment based on a SEM image. Furthermore, the focusing methods are classified, in terms of focusing techniques, into three types, i.e., electromagnetic focusing for adjusting the strength of an electromagnetic lens, electrostatic focusing for adjusting the strength of an electrostatic lens, and mechanical focusing for adjusting the WD. In the present invention, a specific means for the electromagnetic focusing is to adjust the excitation current 23 for the objective lens 7, a specific means for the electrostatic focusing is to adjust the retarding voltage 19, and a specific means for the mechanical focusing is to adjust the WD by raising/lowering the stage 9. As shown in FIGS. 3 to 6, the height at which the electron beam is converged, that is, the focus height, is moved through the electromagnetic focusing and the electrostatic focusing, and the WD is changed through the mechanical focusing.

The relationship between the acceleration voltage and the focusing methods will be summarized.

When the acceleration voltage is 10 kV or lower, the electromagnetic focusing, which is performed by adjusting the excitation current for the objective lens 7, is used for both rough focus adjustment and precise focus adjustment responding to the variation in the height of the wafer 16. The mechanical focusing for adjusting the WD by raising/lowering the stage 9 is not used. The stage 9 is raised/lowered only when the standard WD is changed as a result of a change in acceleration voltage, as in a case in which the acceleration voltage has been changed from 30 kV to 3 kV in FIG. 7.

When the acceleration voltage is 10 kV or higher, the mechanical focusing for adjusting the WD by raising/lowering the stage 9 is used for rough focus adjustment responding to the variation in the height of the wafer 16, and the electrostatic focusing that is performed by adjusting the retarding voltage 19 is used for precise adjustment responding to the variation in the height of the wafer 16. The electromagnetic focusing is not used as a means for focus adjustment.

As described above, when the acceleration voltage exceeds 10 kV, the hysteresis becomes large, and the focusing method is changed significantly. In the following description, an excitation current at which the hysteresis becomes large is called a threshold excitation current, and an acceleration voltage at this time is called a threshold acceleration voltage, as shown in FIG. 7. In this example, the threshold acceleration voltage is 10 kV.

A description has been given above of the fact that the standard values of the initial acceleration voltage, the retarding voltage, the excitation current for the objective lens, and the WD are changed according to the acceleration voltage.

Figure 8:
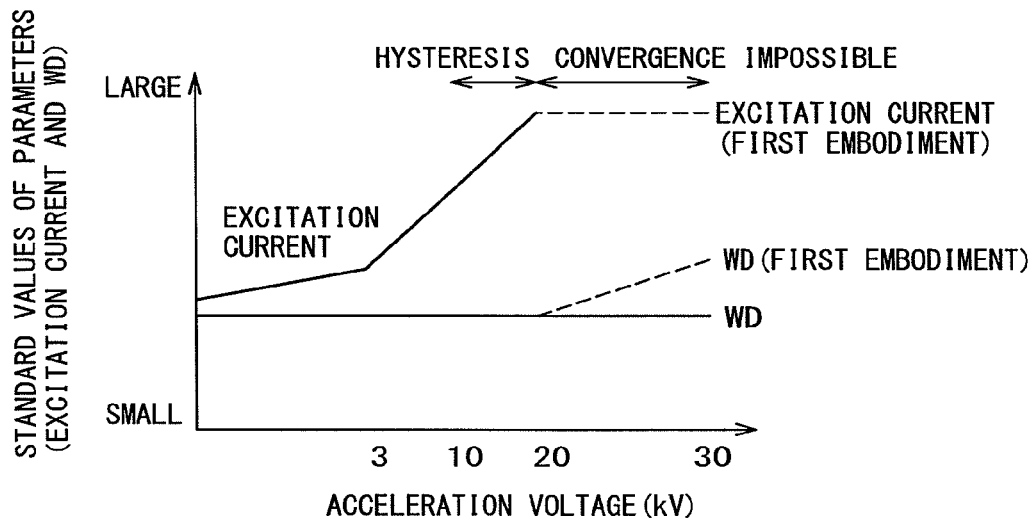
FIG. 8 is a view for explaining a case in which the WD is set short without applying the present invention.
Figure 9:
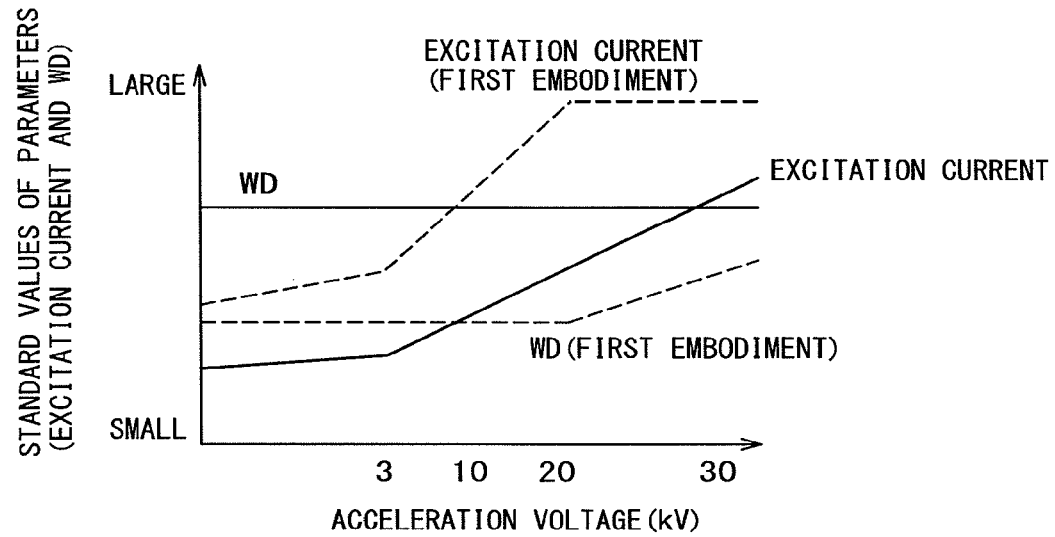
FIG. 9 is a view for explaining a case in which the WD is set long without applying the present invention.

In order to make clear the effect of the present invention, a description will be given of two cases in which the present invention is not applied, compared with cases in which the present invention is applied, with reference to FIGS. 8 and 9.

A case in which the present invention is not applied, and the WD is set short will be described with reference to FIG. 8. In this figure, solid lines indicate a case in which the present invention is not applied, and dashed lines indicate a case in which the present invention is applied. In the case in which the present invention is not applied, because the stage is not raised/lowered, the WD stays constant at any acceleration voltage. Then, when the acceleration voltage is 10 kV or higher, the hysteresis occurs, and thus focusing responding to the variation in the height of the wafer 16 cannot be performed. Furthermore, when the acceleration voltage exceeds 20 kV, convergence of an electron beam becomes impossible. In either of the above-described voltage ranges, pattern dimension measurement cannot be performed. Pattern dimension measurement can be performed only when the acceleration voltage is 10 kV or lower.

A case in which the present invention is not applied, and the WD is set long will be described with reference to FIG. 9. In this figure, solid lines indicate a case in which the present invention is not applied, and dashed lines indicate a case in which the present invention is applied. In the case in which the present invention is not applied, because the stage is not raised/lowered, the WD stays constant at any acceleration voltage. Then, at all the acceleration voltages, convergence of an electron beam and the electromagnetic focusing responding to the variation in the height of the wafer 16 are possible. However, since the WD is extremely long, the resolution deteriorates, and the precision of pattern dimension measurement becomes worse.

This is the end of the description of the two cases in which the present invention is not applied.

FIGS. 10 to 13 show that, when the acceleration voltage is changed, a tolerance for the WD, an excitation-current correction, a retarding-voltage correction, and a deflection signal strength coefficient are secondarily changed in response to changes in the standard values of the initial acceleration voltage, the retarding voltage, the excitation current, and the WD and in the method for rough focus adjustment and precise focus adjustment. These values are stored in the device, in the form of the relationship between the acceleration voltage and the acceptable ranges, in the same way as the initial acceleration voltage and the retarding voltage.

Figure 10:
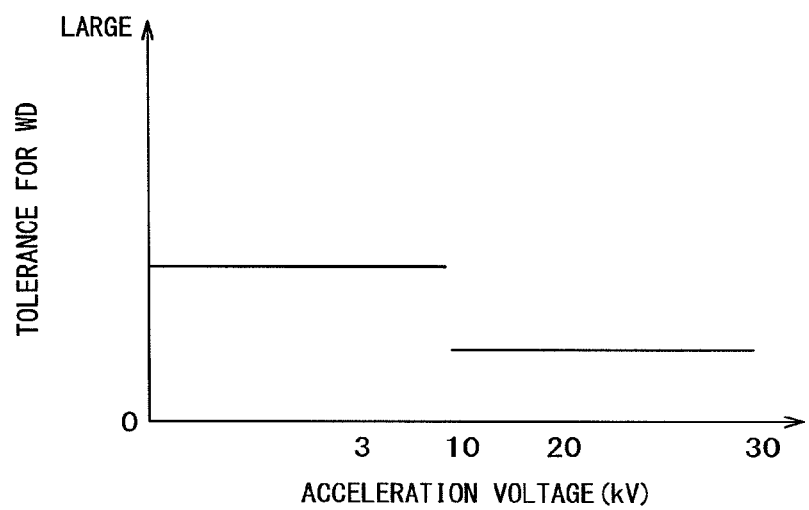
FIG. 10 is a view for explaining a change in WD tolerance with respect to the acceleration voltage.

FIG. 10 shows that the tolerance for the WD is large when the acceleration voltage is 10 kV or lower, and the tolerance for the WD becomes small when the acceleration voltage exceeds 10 kV. This is because, when the acceleration voltage is 10 kV or lower, the electromagnetic focusing is performed, so that a great deal of correction of deviation of the WD can be performed through the electromagnetic focusing, and, on the other hand, when the acceleration voltage is 10 kV or higher, the deviation of the WD needs to be corrected through the electrostatic focusing, so that a great deal of correction thereof cannot be expected through the electrostatic focusing. For this reason, the acceptance range is changed according to the acceleration voltage. Note that, if the precision of raising/lowering of the stage is very high, the precision of raising/lowering of the stage may be used as the acceptance range for the WD, irrespective of the acceleration voltage.

The advantage that the tolerance for the WD is set large when the acceleration voltage is 10 kV or lower will be described here. If the tolerance for the WD is set large, the precision of raising/lowering of the stage can be relaxed. If the precision of raising/lowering of the stage can be relaxed, it is possible to increase the speed of raising/lowering of the stage, thus increasing throughput.

The fact that changing the height of the wafer 16 is equivalent to changing the WD is supplementally mentioned again. The height of the wafer 16 at which the WD becomes the standard WD is called the standard height, and the WD tolerance can be replaced with the height tolerance.

Figure 11:
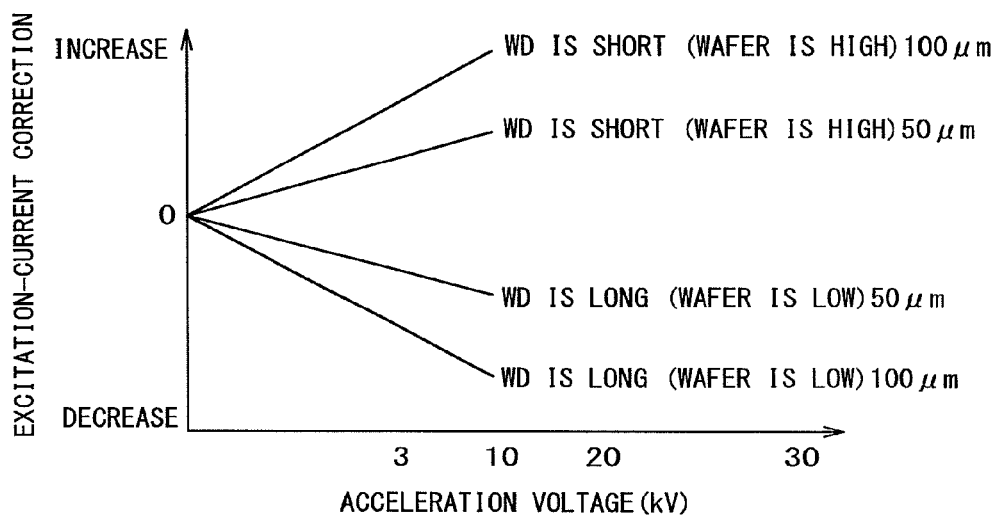
FIG. 11 is a view for explaining a change in excitation-current correction with respect to the acceleration voltage.

FIG. 11 shows that excitation-current corrections used when the real WD is longer and shorter than the standard are changed according to the acceleration voltage. More specifically, in the present invention, when the acceleration voltage is 10 kV or lower, after WD adjustment, the electromagnetic focusing is performed for both rough focus adjustment and precise focus adjustment responding to the variation in the wafer height. During the electromagnetic focusing, the real WD is obtained from the height of the wafer 16 measured by the wafer height sensor 12, the excitation current is increased if the real WD is shorter than the standard WD, and the excitation current is reduced if the real WD is longer than the standard WD. An increase or a decrease in the excitation current during the electromagnetic focusing indicates the excitation-current correction. Here, when the difference between the real WD and the standard WD, that is, the WD error, is large, the excitation-current correction is increased. Furthermore, because the acceleration voltage is generally proportional to the excitation current, the excitation-current correction is increased as the acceleration voltage is increased.

Figure 12:
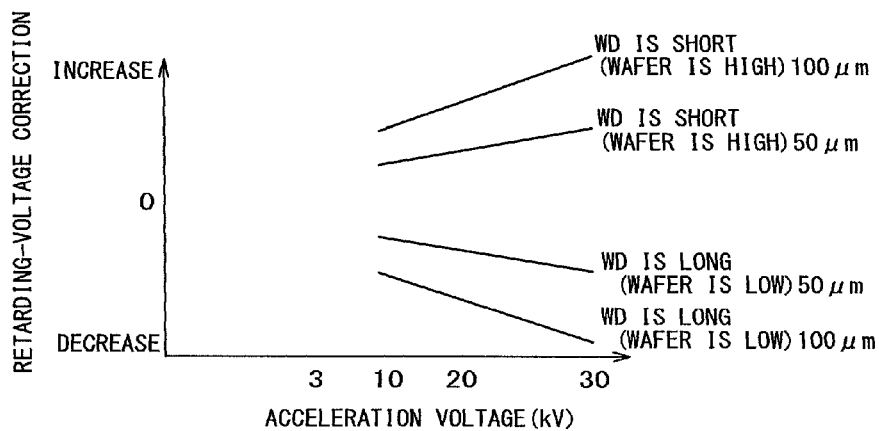
FIG. 12 is a view for explaining a change in retarding-voltage correction with respect to the acceleration voltage.

FIG. 12 shows that retarding-voltage corrections used when the real WD is longer and shorter than the standard are changed according to the acceleration voltage. More specifically, in the present invention, when the acceleration voltage exceeds 10 kV, after WD adjustment, the electrostatic focusing is performed for precise focus adjustment responding to the variation in the wafer height. During the electrostatic focusing, the retarding voltage is increased if the real WD is shorter than the standard WD, and the retarding voltage is reduced if the real WD is longer than the standard WD. An increase or a decrease in the retarding voltage during the electrostatic focusing indicates the retarding-voltage correction. Here, when the WD error is large, the retarding-voltage correction is increased. Furthermore, the retarding-voltage correction is increased as the acceleration voltage is increased.

Figure 13:
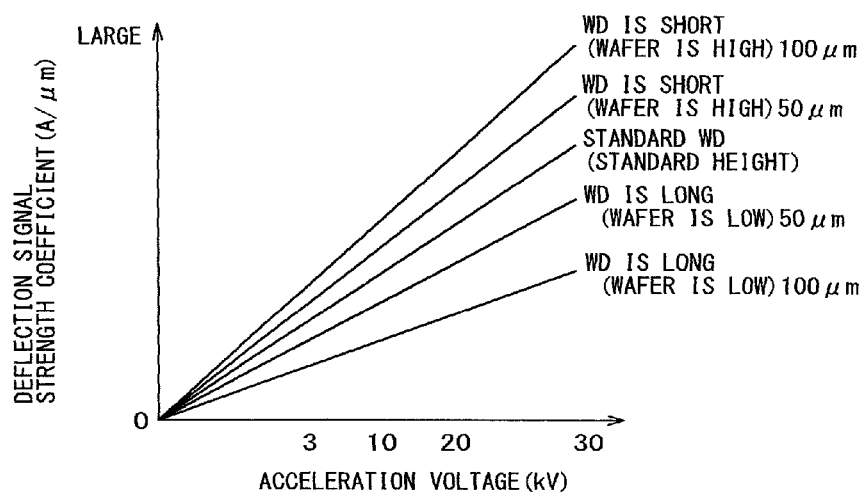
FIG. 13 is a view for explaining a change in deflection signal strength coefficient with respect to the acceleration voltage.

FIG. 13 shows that deflection signal strength coefficients used when the real WD is longer and shorter than the standard are changed according to the acceleration voltage. More specifically, in the present invention, after WD adjustment, the electromagnetic focusing or the electrostatic focusing is performed, and the deflection signal strength coefficient is determined. The deflection signal strength coefficient is the reciprocal of the deflection sensitivity and indicates a current to be applied to the deflector 5 in order to move, by a unit length, the position on the wafer 16 at which the electron beam is landed. The relationship between the electron-beam landing position and the deflection signal is accurately obtained from this value, and highly-accurate dimension measurement becomes possible. When the acceleration voltage is increased, because it is difficult to bend the electron beam, a larger deflection signal needs to be applied, in other words, the deflection signal strength coefficient is increased. Furthermore, when the WD is short, the deflection signal strength coefficient is also increased.

FIGS. 14 to 16 show some functions of the device of the present invention, which particularly relate to the standard values of the excitation current, the WD, the initial acceleration voltage, and the retarding voltage, the tolerance for the WD, the excitation-current correction, the retarding voltage correction, and the deflection signal strength coefficient. Three functions are shown below: a first function of displaying and revising these values; a second function of displaying these values when a recipe is created; and a third function of giving a warning when a recipe with which the standard WD will be changed during processing for a single wafer is created or executed.

FIG. 14 shows a screen for displaying and revising the values obtained from the acceleration voltage, which are the standard values of the excitation current, the WD, the initial acceleration voltage, and the retarding voltage, the tolerance for the WD, the excitation-current correction, the retarding voltage correction, and the deflection signal strength coefficient. In this figure, hyphens indicate no corresponding values. Corresponding values do not exist in rows of the excitation-current correction and the retarding-voltage correction with respect to wafer-height setting errors. This function is required when the values in the table need to be changed due to fabrication of the device or the course of months.

FIG. 15 shows a screen for displaying the values obtained from an acceleration voltage when the acceleration voltage is input at the time of creation of a recipe. In this screen, the user can change the fields having the acceleration voltage and cannot change the fields having the values obtained from the acceleration voltage. With this function, the user can easily check conditions for dimension measurement.

FIG. 16 shows a warning to be displayed when a recipe with which the standard WD will be changed during processing for a single wafer is created or executed. The purpose of this function will be described. It takes time to execute a recipe with which the WD will be changed, compared with a recipe with which the WD will not be changed. Therefore, when only dimension measurement of the top needs to be performed at a low acceleration voltage, that is, when the WD need not be changed, this warning is displayed to prevent the user from erroneously creating or executing such a recipe with which the WD will be changed.

Figure 20:
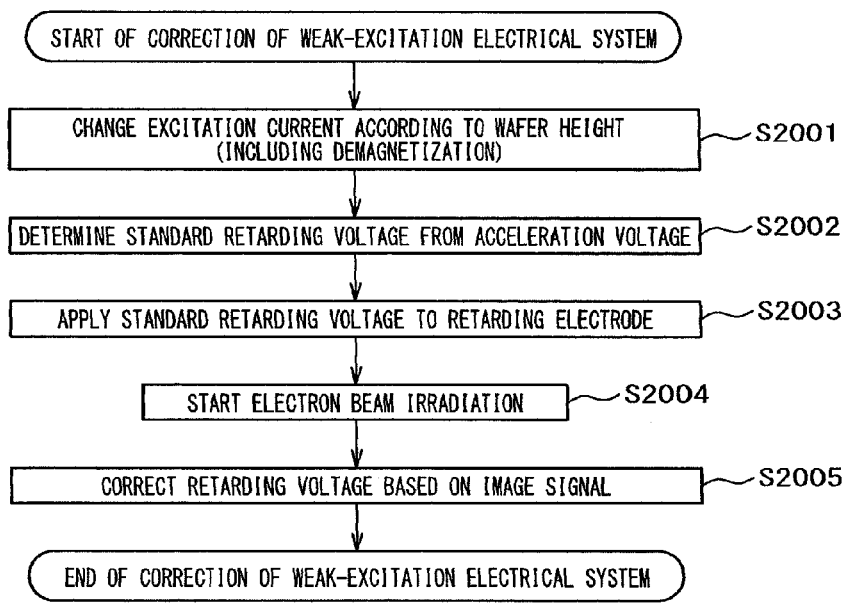
FIG. 20 is a flowchart showing weak-excitation electric-system correction.
Figure 21:
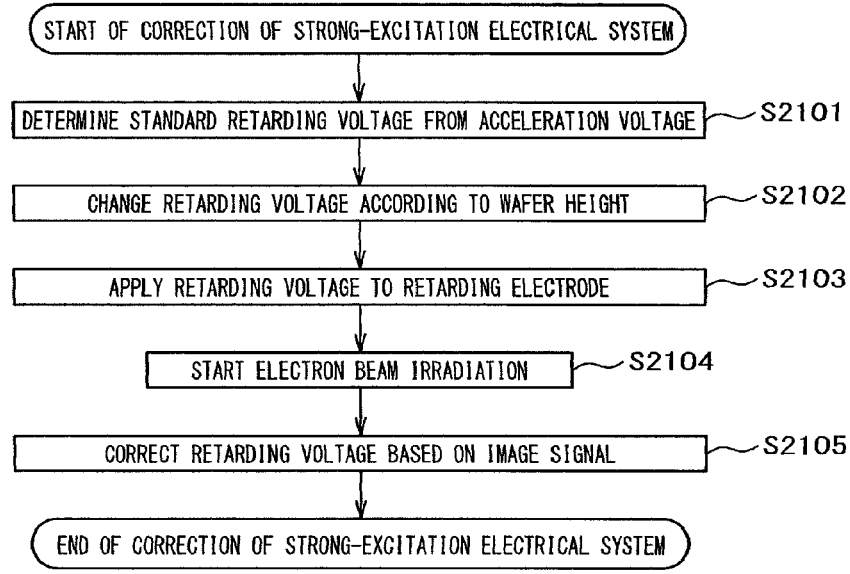
FIG. 21 is a flowchart showing strong-excitation electric-system correction.
Figure 22:
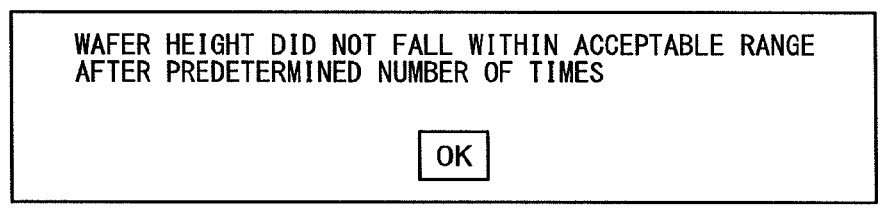
FIG. 22 is a view showing an error screen used in the WD adjustment.
Figure 23:
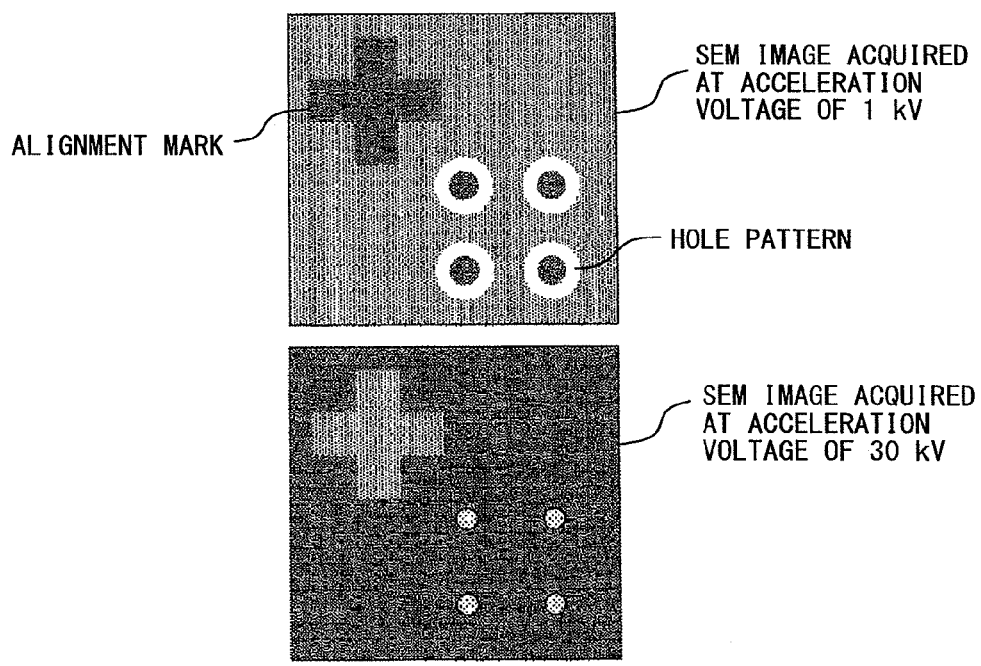
FIG. 23 is a view showing a SEM-image display screen.
Figure 24:
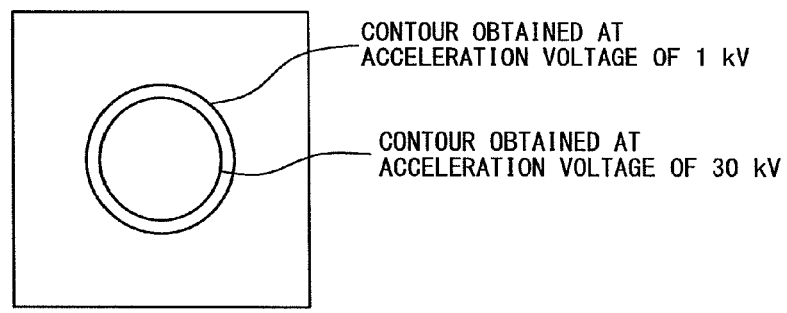
FIG. 24 is a view showing a SEM-image display screen in which outlines are displayed in an overlapped manner.

FIGS. 17 to 24 are used to explain processing of the device of the present invention in detail. FIGS. 17 to 21 are flowcharts. FIG. 22 shows an error screen used in error processing. FIGS. 23 and 24 relate to display of SEM images.

Figure 17:
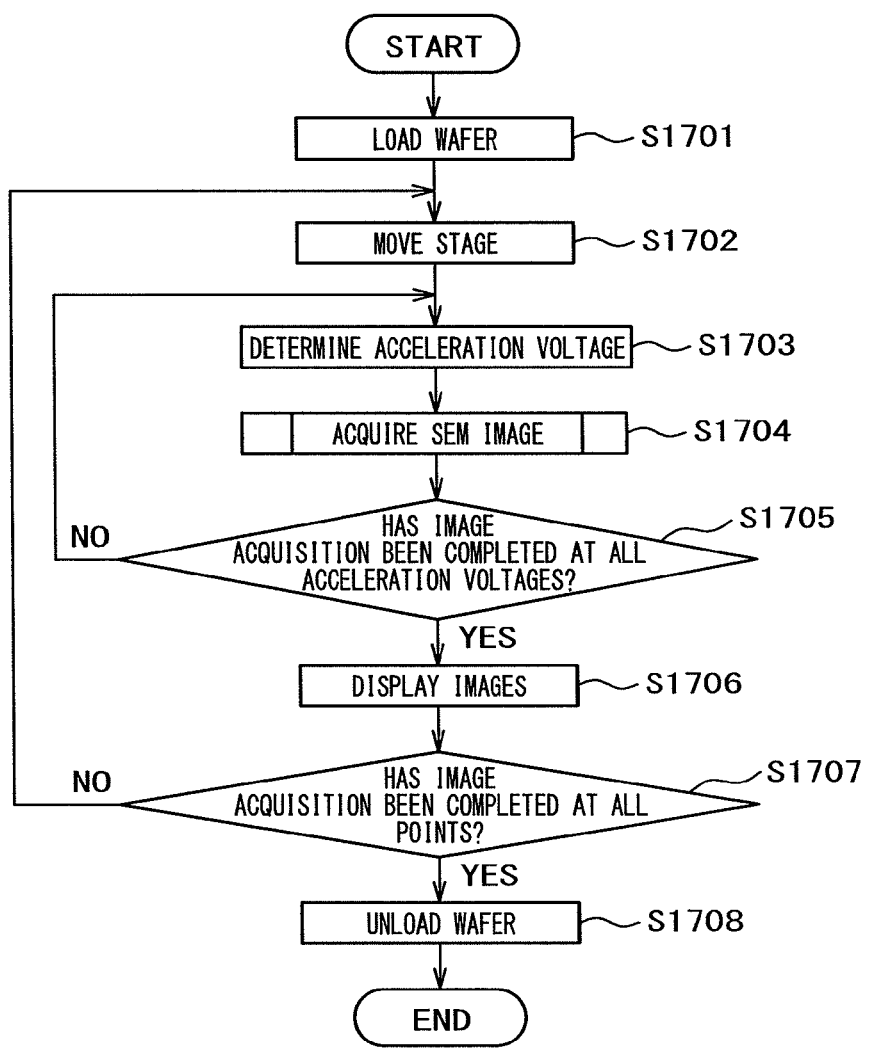
FIG. 17 is a flowchart showing processing for a single wafer.
Figure 18:
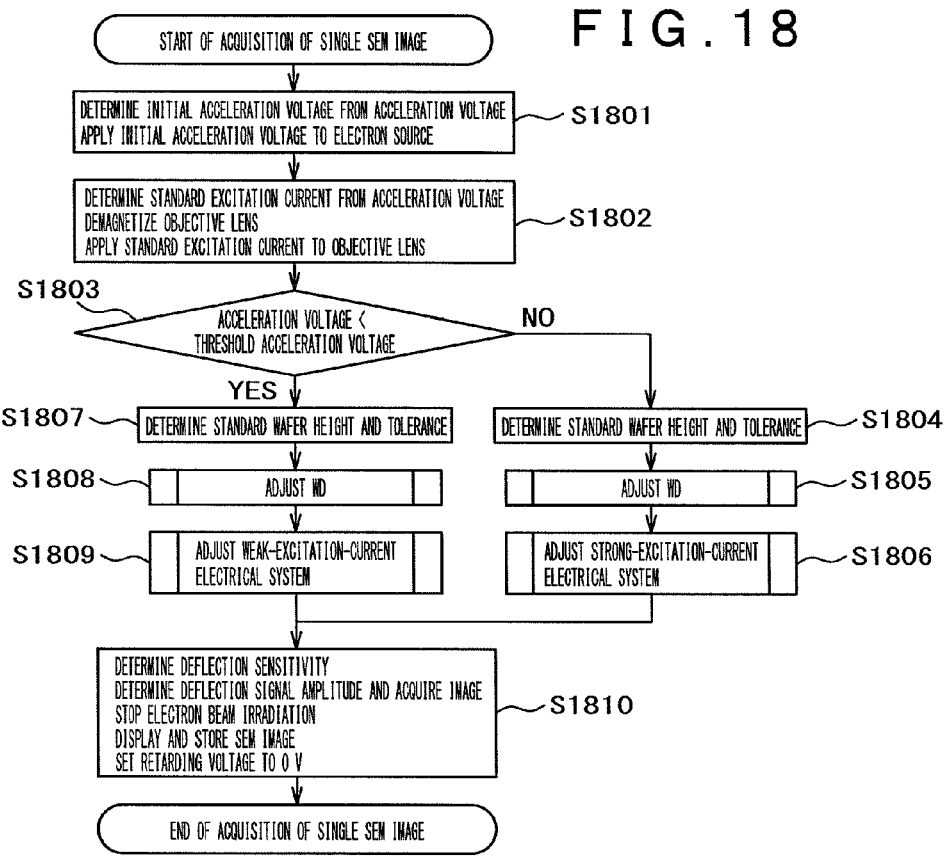
FIG. 18 is a flowchart showing processing of acquisition of a single SEM image.
Figure 19:
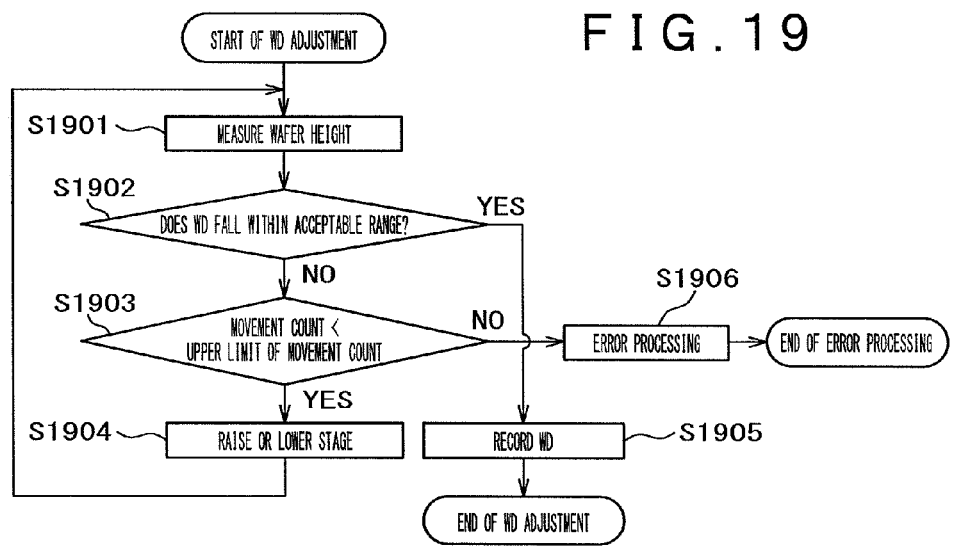
FIG. 19 is a flowchart showing WD adjustment.

Before describing the flowcharts of FIGS. 17 to 21, the relationships among the flowcharts will be described. FIG. 17 is a flowchart of processing for a single wafer, and FIGS. 18 to 21 show details thereof. FIG. 18 is a flowchart of processing performed to acquire a single image, and this flowchart is called from the flowchart of FIG. 17. FIGS. 19 to 21 are flowcharts of processing of WD adjustment, weak-excitation electric-system correction, and strong-excitation electric-system correction, and these flowcharts are called from the flowchart of FIG. 18. The flowcharts of FIGS. 19 to 21 will be described first, and the flowcharts of FIGS. 17 and 18 will be described later.

FIG. 19 is the flowchart of WD adjustment. This processing is performed so as to make the difference between the height of the real WD and the standard WD, that is, the WD error, smaller than the WD tolerance, in other words, so as to make the WD fall within the acceptance range, as shown in FIG. 2. At start of this processing, the standard value of the WD and the tolerance for the WD are already determined. In this processing, the height of the wafer 16 is measured by the wafer height sensor 12, thus obtaining the real WD (S1901). Then, raising/lowering of the stage 9 is repeated until the real WD falls within the acceptance range (S1904). If the WD falls within the acceptance range (S1902), the WD is recorded (S1905). If the WD does not fall within the acceptance range after a predetermined number of times of raising/lowering (S1903), error processing is performed (S1906). In the error processing, a message indicating that the WD did not fall within the acceptance range is displayed, as shown in FIG. 22, and the sequence is stopped. Note that, if the height of the WD has already fallen within the acceptance range at the start of this processing of WD adjustment, this processing ends without raising/lowering the stage. Note that changing the height of the wafer 16 is equivalent to changing the WD, the standard WD can be replaced with the standard height, and the WD tolerance can be replaced with the height tolerance, as described above.

FIG. 20 is the flowchart of processing of weak-excitation electric-system correction. In this processing, the electromagnetic focusing, shown in FIG. 5, is performed for both rough focus adjustment and precise focus adjustment, and the electrostatic focusing, shown in FIG. 6, is performed for fine focus adjustment. At start of this processing, the acceleration voltage and the WD error are already determined. First, the excitation-current correction is determined from the acceleration voltage and the WD error on the basis of the relationship shown in FIG. 11, and the excitation current for the objective lens 7 is corrected (S2001). This is the end of the electromagnetic focusing for both rough focus adjustment and precise focus adjustment. Next, the standard retarding voltage is obtained from the acceleration voltage on the basis of the relationship shown in FIG. 7 (S2002) and is applied to the retarding electrode 8 (S2003). Then, irradiation of an electron beam is started (S2004), and the electrostatic focusing that is performed by adjusting the retarding voltage is performed (S2005). At this time, the adjustment may be performed not with an image of a measurement point but with an image of a point near the measurement point. Thus, it is possible to reduce the levels of electrostatic charge at or damage to the measurement point. This is the end of the electrostatic focusing for fine focus adjustment, and this is also the end of the processing of the weak-excitation-current electric-system correction. Note that the fine focus adjustment based on an image signal may be performed through the electromagnetic focusing.

FIG. 21 is the flowchart of strong-excitation electric-system correction. In this processing, the electrostatic focusing, shown in FIG. 6, is performed for precise focus adjustment and fine focus adjustment. At start of this processing, the acceleration voltage and the WD error are already determined. First, the standard retarding voltage is determined from the acceleration voltage on the basis of the relationship shown in FIG. 7 (S2101). Then, the retarding-voltage correction is determined from the acceleration voltage and the WD error on the basis of the relationship shown in FIG. 12 (S2102). A retarding voltage obtained after the standard retarding voltage is corrected by the retarding-voltage correction is applied to the retarding electrode 8 (S2103). This is the end of the electrostatic focusing for precise focus adjustment. Then, irradiation of an electron beam is started (S2104), and the electrostatic focusing that is performed by adjusting the retarding voltage is performed (S2105). At this time, the adjustment may be performed not with an image of a measurement point but with an image of a point near the measurement point. Thus, it is possible to reduce the levels of electrostatic charge at or damage to the measurement point. This is the end of the electrostatic focusing for fine focus adjustment, and this is also the end of the processing of the strong-excitation-current electric-system correction.

FIG. 17 is the flowchart of processing for a single wafer and shows, in outline, the processing for a single wafer. First, a wafer is loaded (S1701) and is moved to the measurement point by horizontally moving the stage (S1702). The acceleration voltage is determined according to the recipe (S1703), and a SEM image is acquired (S1704). These steps are repeated while changing the acceleration voltage, and, if image acquisition is completed at all acceleration voltages at one measurement point (S1705), images acquired at the different acceleration voltages are displayed side by side (S1706). If image acquisition is completed at one measurement point, the stage 9 is horizontally moved, and image acquisition and dimension measurement are performed at the next measurement point. These movement of the stage 9 and measurement are repeated, and, if measurement is completed at all the measurement points (S1707), the wafer 16 is unloaded (S1708).

FIGS. 23 and 24 relate to SEM-image display performed in the flowchart of FIG. 17. In the display step in the flowchart of FIG. 17, SEM images acquired at different acceleration voltages at one measurement point are displayed, as shown in FIG. 23. At this time, if the visual field is misaligned as a result of the change in acceleration voltage, the misalignment of the visual field can be corrected based on a SEM image of an alignment mark or a typical SEM image (not shown) acquired in advance at each acceleration voltage. Furthermore, as shown in FIG. 24, outlines extracted from images acquired at respective acceleration voltages may be displayed in an overlapped manner.

This is the end of the description of the processing for a single wafer.

FIG. 18 is the flowchart of acquisition of a single SEM image, and this flowchart is called from the step of acquiring a SEM image (S1704) in the flowchart of FIG. 17. Because the acceleration voltage is already determined at start of this processing, the initial acceleration voltage, the standard excitation current, the standard WD, and the WD tolerance can be determined on the basis of the relationship shown in FIG. 7. At the beginning of this processing, two steps are performed. In a first step, the initial acceleration voltage is determined from the acceleration voltage and is applied to the electron source 1 (S1801). The reason why the initial acceleration voltage is applied at the beginning is because it takes time until an electron gun becomes stable. In a second step, the standard excitation current is determined from the acceleration voltage, the objective lens is demagnetized, and then, the standard excitation current is applied to the objective lens (S1802). The reason why the standard excitation current is applied at the beginning is because it takes time until the objective lens becomes stable. Steps to be performed next differ depending on whether the acceleration voltage is higher or lower than the threshold acceleration voltage.

If the acceleration voltage is lower than the threshold acceleration voltage in the flowchart of FIG. 18, the standard WD and the WD tolerance are determined from the acceleration voltage (S1807), and the processing of WD adjustment, shown in FIG. 19, is performed (S1808), thus making the WD fall within the acceptance range from the standard WD. This step always serves to deal with a change in the standard WD caused by a change in the acceleration voltage. Then, the processing of weak-excitation electric-system adjustment, shown in FIG. 20, is performed (S1809). Specifically, the electromagnetic focusing, shown in FIG. 5, is performed for both rough focus adjustment and precise focus adjustment, and the electrostatic focusing, shown in FIG. 6, is performed for fine focus adjustment.

If the acceleration voltage is higher than the threshold acceleration voltage in the flowchart of FIG. 18, the standard WD and the WD tolerance are determined from the acceleration voltage (S1804), and the processing of WD adjustment, shown in FIG. 19, is performed, thus making the WD fall within the acceptance range from the standard WD. The determination of the standard WD and the WD tolerance and the processing of adjustment are the same as those performed in the case in which the acceleration voltage is lower than the threshold acceleration voltage; however, in the case in which the acceleration voltage is higher than the threshold acceleration voltage, the WD is used for rough focus adjustment, and the WD tolerance is set small, as shown in FIG. 10. After the WD adjustment (S1805), the processing of strong-excitation electric-system correction, shown in FIG. 21, is performed (S1806). Specifically, the electrostatic focusing, shown in FIG. 6, is performed for precise focus adjustment and fine focus adjustment.

When the weak-excitation electric-system adjustment or the strong-excitation electric-system adjustment is completed in the flowchart of FIG. 18, the acceleration voltage and the WD error are already determined. The acceleration voltage is already determined at the start of the processing of FIG. 18, and the WD error is determined at the time of the processing of WD adjustment. The deflection signal strength coefficient is obtained from the acceleration voltage and the WD error on the basis of the relationship shown in FIG. 13, the deflection signal amplitude is determined from a magnification set in the recipe and the deflection signal strength coefficient, and a SEM image is acquired. Then, irradiation of the electron beam is stopped, and the retarding voltage is set to 0 V (S1810). Furthermore, the acquired image is displayed and stored. Irradiation of the electron beam is stopped in this step in order to prevent contamination, electrostatic charge, etc., of the wafer 16, which are caused by irradiation of the electron beam. Furthermore, the retarding voltage is set to 0 V in order to prevent discharge from occurring later when the stage 9 is raised/lowered.

After the processing of acquisition of a single SEM image is completed, in this way, the flow returns to the processing for a single wafer, shown in FIG. 17. As described earlier, the processing of acquisition of a single SEM image, shown in FIG. 18, is repeated while changing the acceleration voltage, and, if the image acquisition is completed at one measurement point, the stage 9 is horizontally moved, and image acquisition and dimension measurement are performed at the next measurement point. These movement of the stage 9 and measurement are repeated.

Dimension measurement of upper portions and bottom portions of holes and grooves on the wafer performed using the scanning electron beam device of Embodiment 1 will be described below.

For example, in a low-acceleration-voltage region of 10 kV or lower, as shown in FIG. 7, the WD is set short, rough focus adjustment and precise focus adjustment responding to the variation in the height of the wafer are performed through the electromagnetic focusing, which is performed by adjusting the excitation current for the objective lens. By shortening the WD at a low acceleration voltage, the levels of the chromatic aberration and the spherical aberration are reduced, thereby making it possible to prevent deterioration of the resolution at the low acceleration voltage and to measure the upper portions of holes and grooves on the wafer with high precision.

For example, in a high-acceleration-voltage region of 10 kV or higher, rough focus adjustment responding to the variation in the height of the wafer is performed through the mechanical focusing for adjusting the WD by raising/lowering the stage. Furthermore, precise focus adjustment is performed through the electrostatic focusing that is performed by adjusting the retarding voltage. Because the electromagnetic focusing, which is performed by adjusting the excitation current for the objective lens, is not used as a focus adjustment means, it is unnecessary to change the excitation current for rough focus adjustment, thus making it possible to avoid the influence of the hysteresis caused by the change in the excitation current and to measure the bottom portions of holes and grooves on the wafer in a short time and with precision.

For example, in an even-higher-acceleration-voltage region of 20 kV or higher, as shown in FIG. 7, the WD is extended, and the excitation current is set so as not to magnetically saturate an excitation coil, thereby making it possible to avoid the influence of magnetic saturation and to exclude a situation in which the bottom portions of holes and grooves on the wafer cannot be measured.

According to this Embodiment, provided is a dimension measurement method using a scanning electron beam device that includes an electron source, a deflector for deflecting an electron beam emitted from the electron source, an objective lens for converging the electron beam, a retarding electrode, a stage on which a wafer is loaded, and a controller, and that acquires a SEM image of the wafer by radiating the electron beam onto the wafer and detecting secondary electrons generated from the wafer, the method including the steps of: in order to acquire SEM images while changing an acceleration voltage, acquiring, when a low-acceleration electron beam is used to measure upper portions of a hole and a groove on the wafer, an image after shortening a WD; acquiring, when a high-acceleration electron beam is used to measure bottom portions of the hole and the groove on the wafer, an image after performing rough focus adjustment responding to a variation in the height of the wafer, through mechanical focusing for adjusting the WD by raising/lowering the stage or the objective lens; and measuring dimensions of the upper portions and the bottom portions of the hole and the groove on the wafer, from the acquired images.

In the dimension measurement method using the scanning electron beam device, when the low-acceleration electron beam is used to measure the upper portions of the hole and the groove on the wafer, rough focus adjustment and precise focus adjustment responding to the variation in the height of the wafer are performed through electromagnetic focusing that is performed by adjusting an excitation current for the objective lens.

Furthermore, in the dimension measurement method using the scanning electron beam device, when the high-acceleration electron beam is used to measure the bottom portions of the hole and the groove on the wafer, precise focus adjustment responding to the variation in the height of the wafer is performed through electrostatic focusing that is performed by adjusting a retarding voltage applied to the retarding electrode.

Furthermore, in the dimension measurement method using the scanning electron beam device, when the high-acceleration electron beam is used to measure the bottom portions of the hole and the groove on the wafer, the WD is extended by raising/lowering the stage, on which the wafer is loaded, and an image is acquired using an excitation current with which the excitation coil is not magnetically saturated.

Second Embodiment

Figure 25:
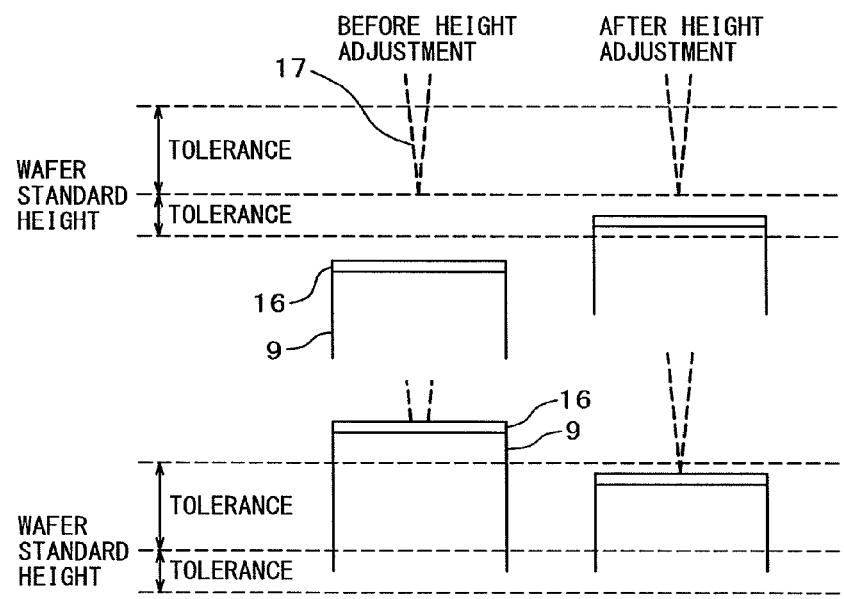
FIG. 25 is a view for explaining WD tolerances according to Embodiment 2.

In Embodiment 1, the WD tolerance at a longer-WD side and the WD tolerance at a shorter-WD side may be set to different values. In particular, as shown in FIG. 25, the WD tolerance at the longer-WD side should be smaller than the WD tolerance at the shorter-WD side. This is because, if the WD tolerance at the longer-WD side is too large, when the acceleration voltage is high, and the electrostatic focusing is performed after WD adjustment, the retarding voltage is reduced too much, which causes a situation in which secondary electrons cannot be detected, in some cases.

Third Embodiment

In Embodiments 1 and 2, the WD adjustment performed by raising/lowering the stage may be replaced with WD adjustment performed by raising/lowering the objective lens. In response to this, mechanical focusing that uses WD adjustment performed by raising/lowering the stage is replaced with mechanical focusing that uses WD adjustment performed by raising/lowering the objective lens.

Figure 26:
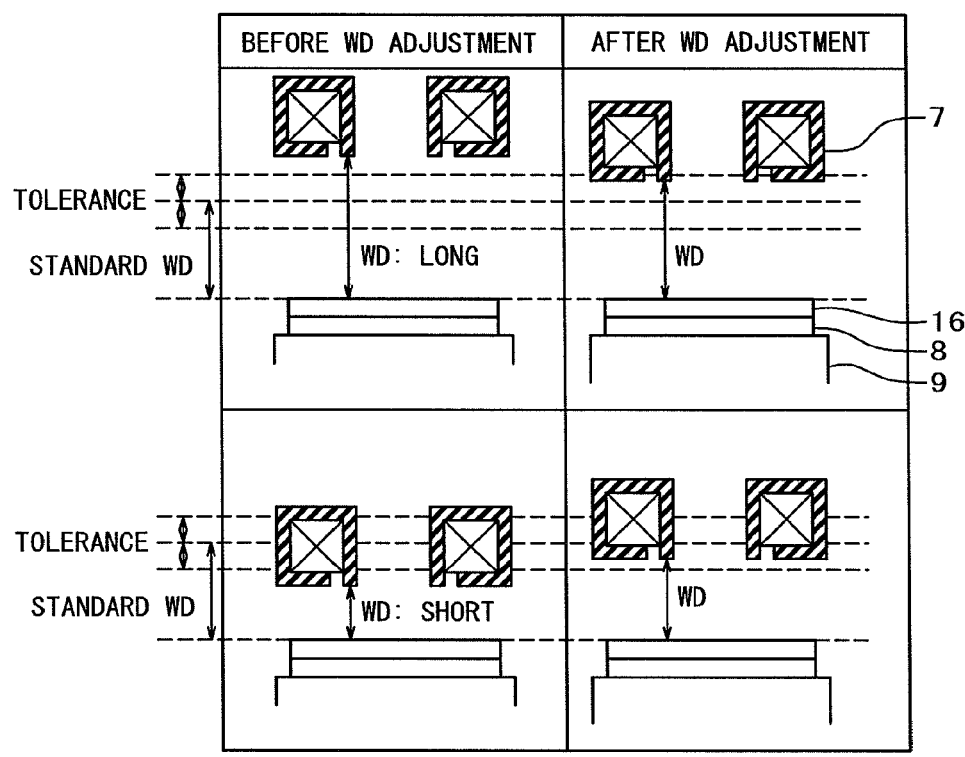
FIG. 26 is a view for explaining WD adjustment that is performed by raising/lowering the objective lens, according to Embodiment 3.

FIG. 26 is a view for explaining the WD adjustment performed by raising/lowering the objective lens. An upper part in this figure shows a case in which, when the WD is too long, the WD is made to fall within the acceptance range by lowering the objective lens 7. Furthermore, a lower part in this figure shows a case in which, when the WD is too short, the WD is made to fall within the acceptance range by raising the objective lens 7.

Figure 27:
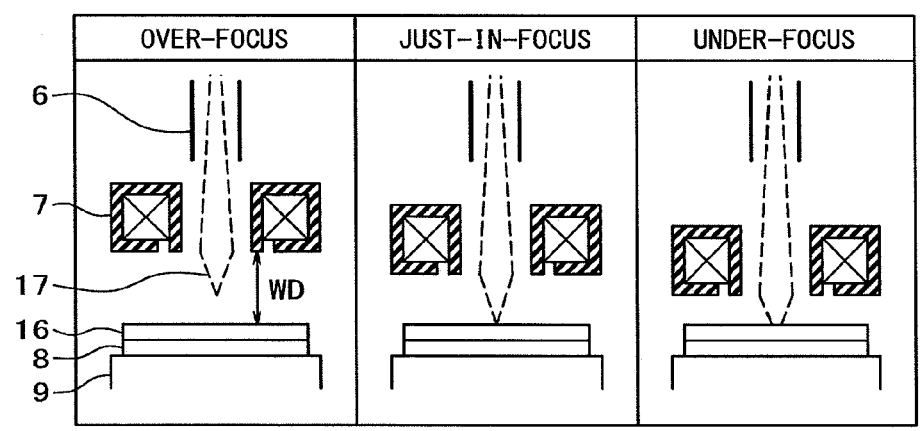
FIG. 27 is a view for explaining mechanical focusing that is performed by raising/lowering the objective lens, according to Embodiment 3.

FIG. 27 is a view for explaining mechanical focusing that uses the WD adjustment performed by raising/lowering the objective lens. In the mechanical focusing performed by raising/lowering the objective lens, shown in this figure, the objective lens is lowered in the over-focus state and is raised in the under-focus state, thereby adjusting the WD and leading to the just-in-focus state.

Figure 28:
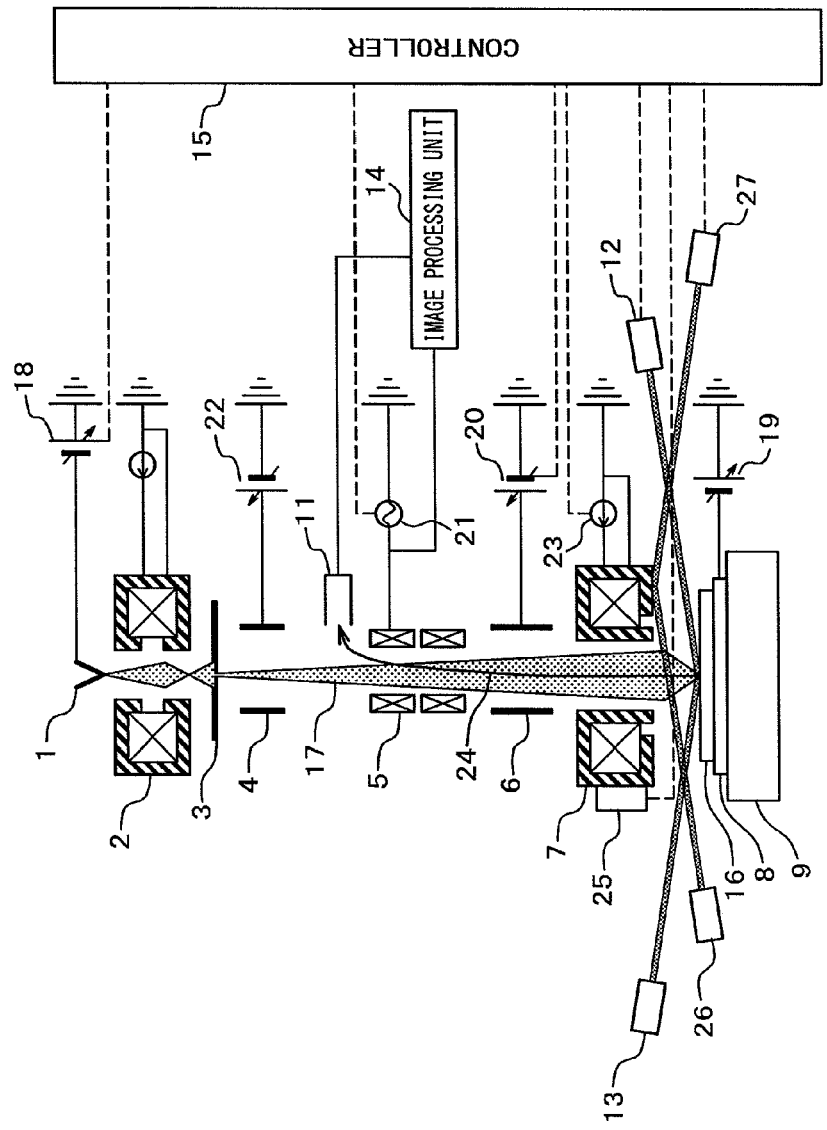
FIG. 28 is a view for explaining the configuration of a device according to Embodiment 3 of the present invention.

FIG. 28 shows the configuration of a device in which the objective lens is raised/lowered. Unlike the case shown in Embodiment 1, the stage 9 is not raised/lowered. On the other hand, the objective lens 7 can be raised/lowered by an objective-lens lift 25, and an objective-lens height sensor 27 and a light source 26 for the objective-lens height sensor are additionally provided. This is because, when the objective lens is raised/lowered, an error in the height of the objective lens occurs. The WD is obtained from the height of the objective lens 7 measured by the objective-lens height sensor 27 and the height of the wafer 16 measured by the wafer height sensor 12. Thick lines in the figure denote light paths. Furthermore, the respective parts are comprehensively controlled by the controller 15. In particular, the initial acceleration voltage 18, the boosting voltage 20, the retarding voltage 19, the excitation current 23 for the objective lens 7, and the height of the objective lens 7 are comprehensively controlled according to the acceleration voltage, which is a feature of the present invention. These control relationships, which show the feature of the present invention, are indicated by dashed lines in the figure.

Fourth Embodiment

Figure 29:
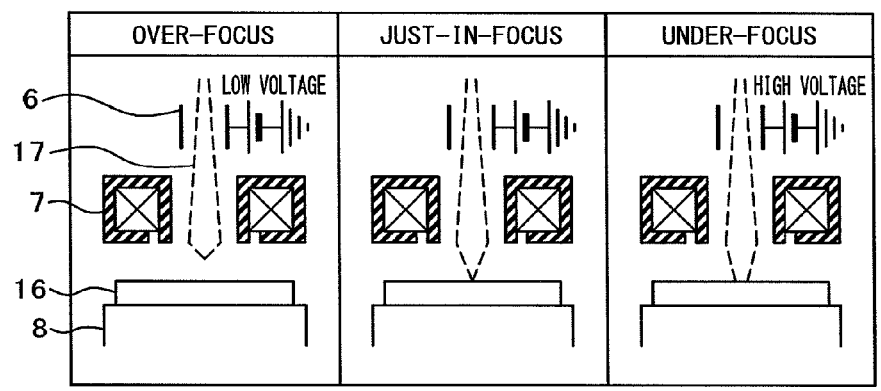
FIG. 29 is a view for explaining electrostatic focusing that is performed by adjusting a boosting voltage, according to Embodiment 4.
Figure 30:
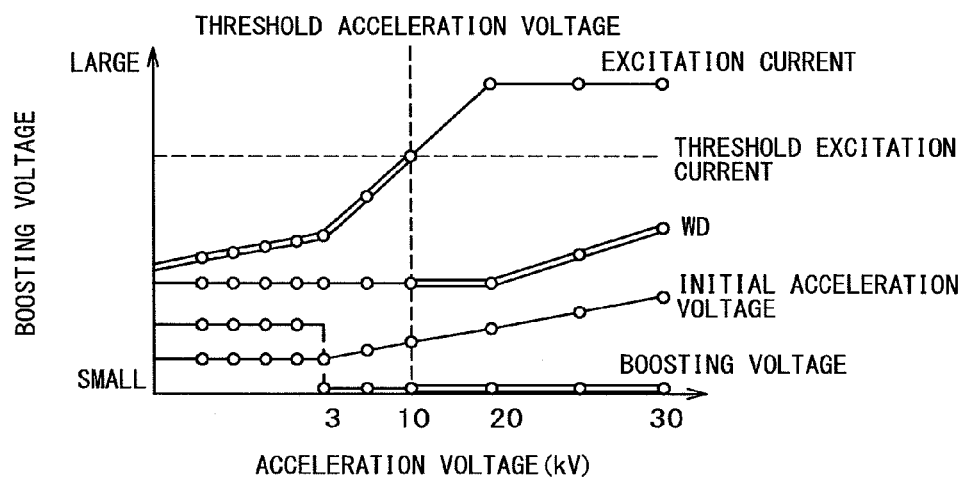
FIG. 30 is a view for explaining changes in excitation current, WD, initial acceleration voltage, and boosting voltage with respect to the acceleration voltage, according to Embodiment 4.

In Embodiments 1 to 3, the electrostatic focusing that is performed by adjusting the retarding voltage can be replaced with electrostatic focusing that is performed by adjusting the boosting voltage, shown in FIG. 29. In this case, the device stores, in advance, a standard boosting voltage with respect to the acceleration voltage, as shown in FIG. 30. Here, double-lined portions in FIG. 30 are used as focusing means.

Figure 31:
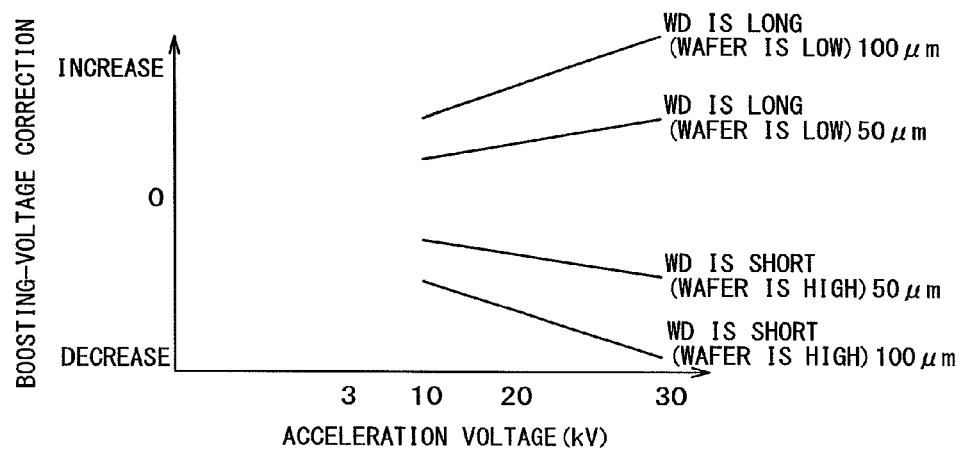
FIG. 31 is a view for explaining a boosting-voltage correction according to Embodiment 4.

Furthermore, the device also stores a boosting-voltage correction shown in FIG. 31.

Fifth Embodiment

Figure 32:
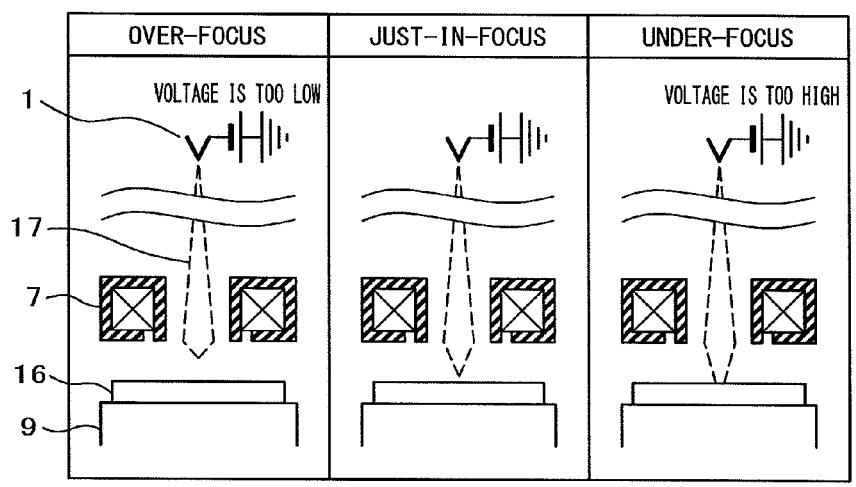
FIG. 32 is a view for explaining electrostatic focusing that is performed by adjusting the initial acceleration voltage, according to Embodiment 5.
Figure 33:
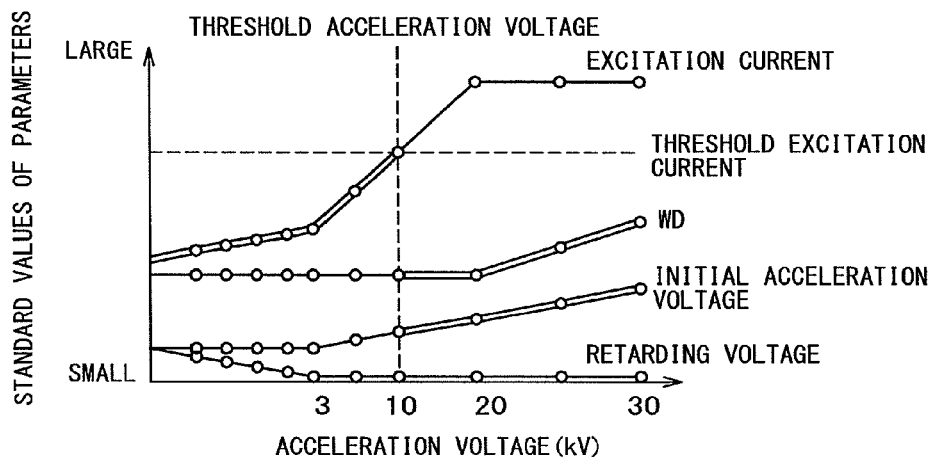
FIG. 33 is a view for explaining the standard values of the excitation current, the WD, the initial acceleration voltage, and the retarding voltage with respect to the acceleration voltage, according to Embodiment 5.
Figure 34:
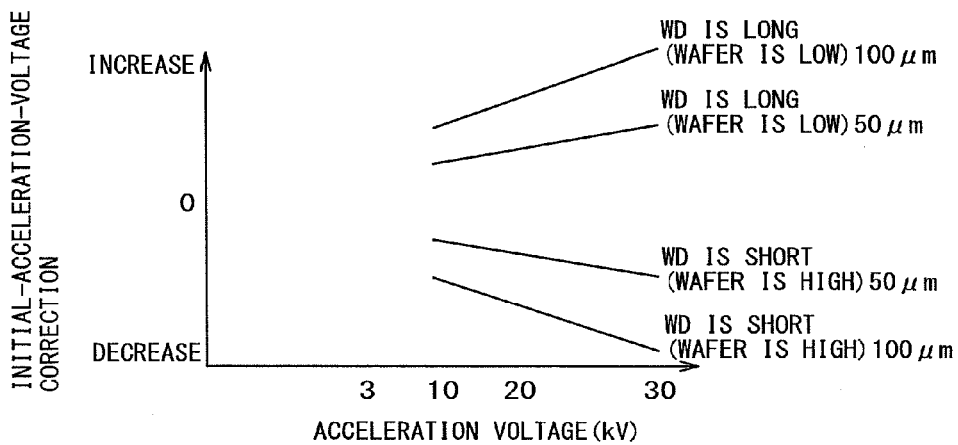
FIG. 34 is a view for explaining an initial-acceleration-voltage correction according to Embodiment 5.

In Embodiments 1 to 3, the electrostatic focusing that is performed by adjusting the retarding voltage can be replaced with electrostatic focusing that is performed by adjusting the initial acceleration voltage, shown in FIG. 32. In this case, as indicated by double lines in FIG. 33, when the acceleration voltage is high, the initial acceleration voltage is changed in response to the variation in the wafer height. Furthermore, the device stores an initial-acceleration-voltage correction, as shown in FIG. 34.

Sixth Embodiment

Figure 35:
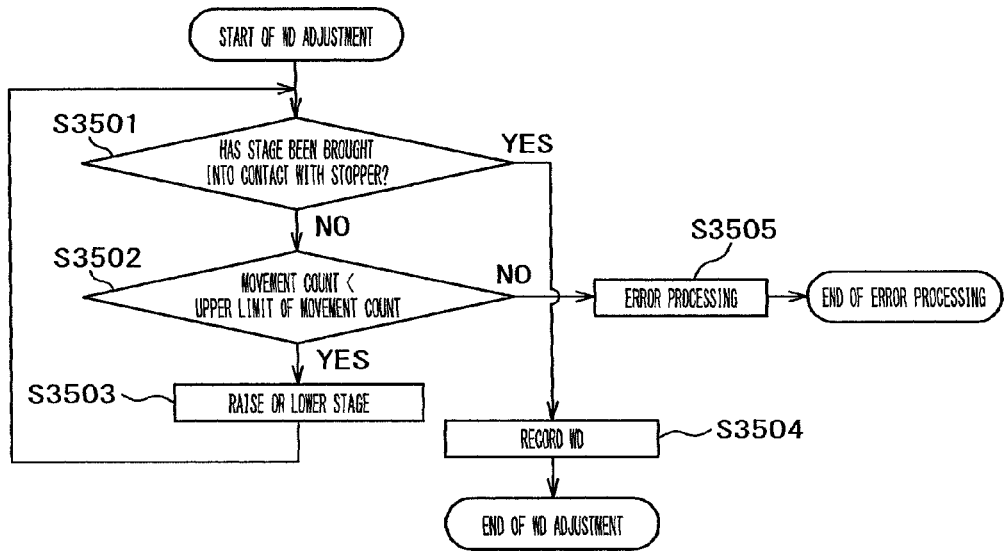
FIG. 35 is a flowchart showing WD adjustment according to Embodiment 6.

In Embodiments 1 to 5, the height of the stage may be adjusted with high precision by bringing the stage 9 into contact with a stopper. In this case, the height of the wafer 16 is not measured, and the stage is raised/lowered based on whether the stage has been brought into contact with the stopper. Processing of WD adjustment is shown in FIG. 35. However, values that can be set for the WD are discrete values, for example, two different values, and the rough-focus-adjustment function is lost, thus increasing the loads of the electromagnetic focusing and the electrostatic focusing.

Seventh Embodiment

Figure 36:
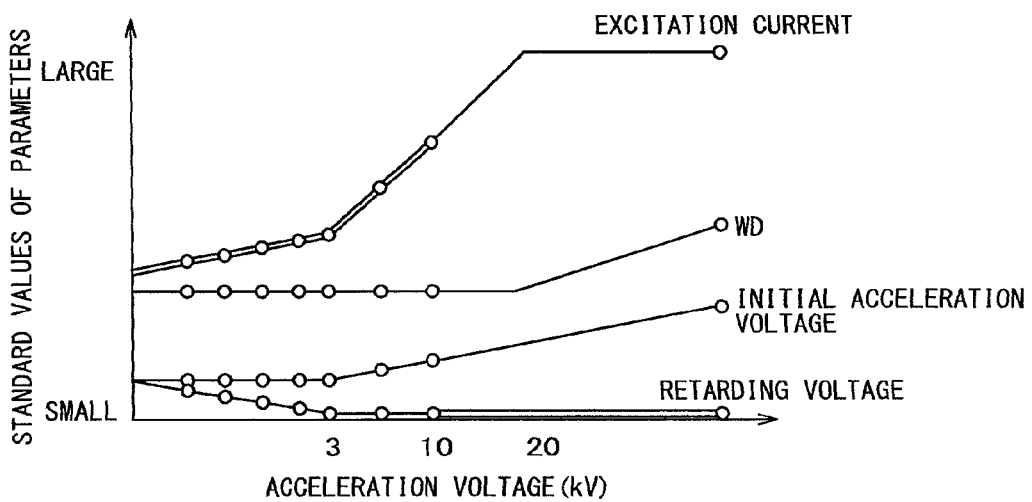
FIG. 36 is a view for explaining the standard values of the excitation current, the WD, the initial acceleration voltage, and the retarding voltage with respect to the acceleration voltage, according to Embodiment 7.

In Embodiment 6, settable acceleration voltages are selected such that the WD has a small number of values, in this case, two different values, as shown in FIG. 36. Here, double-lined portions in FIG. 36 are used as focusing means. By doing so, the loads of the electromagnetic focusing and the electrostatic focusing that are increased once in Embodiment 6 can be relaxed.

Eighth Embodiment

Figure 37:
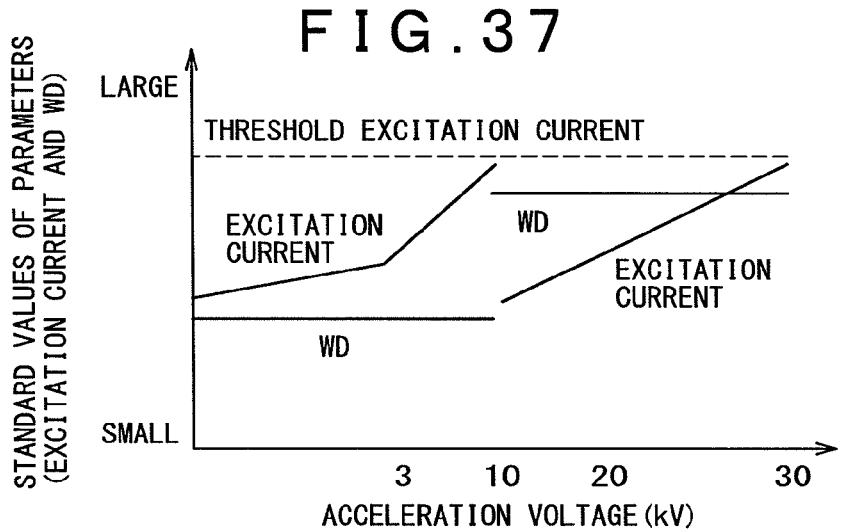
FIG. 37 is a view for explaining the standard values of the excitation current and the WD with respect to the acceleration voltage, according to Embodiment 8.

In Embodiments 6 and 7, the WD is set such that the excitation current is always smaller than the threshold excitation current at any acceleration voltage, as shown in FIG. 37. By doing so, it is possible to perform rough focus adjustment and precise focus adjustment by adjusting the excitation current for the objective lens, at any acceleration voltage. In this case, because the standard excitation current does not become larger than the threshold excitation current in the flowchart of FIG. 18, the processing of strong-excitation electric-system adjustment, shown in FIG. 21, is unnecessary.

Ninth Embodiment

Figure 38:
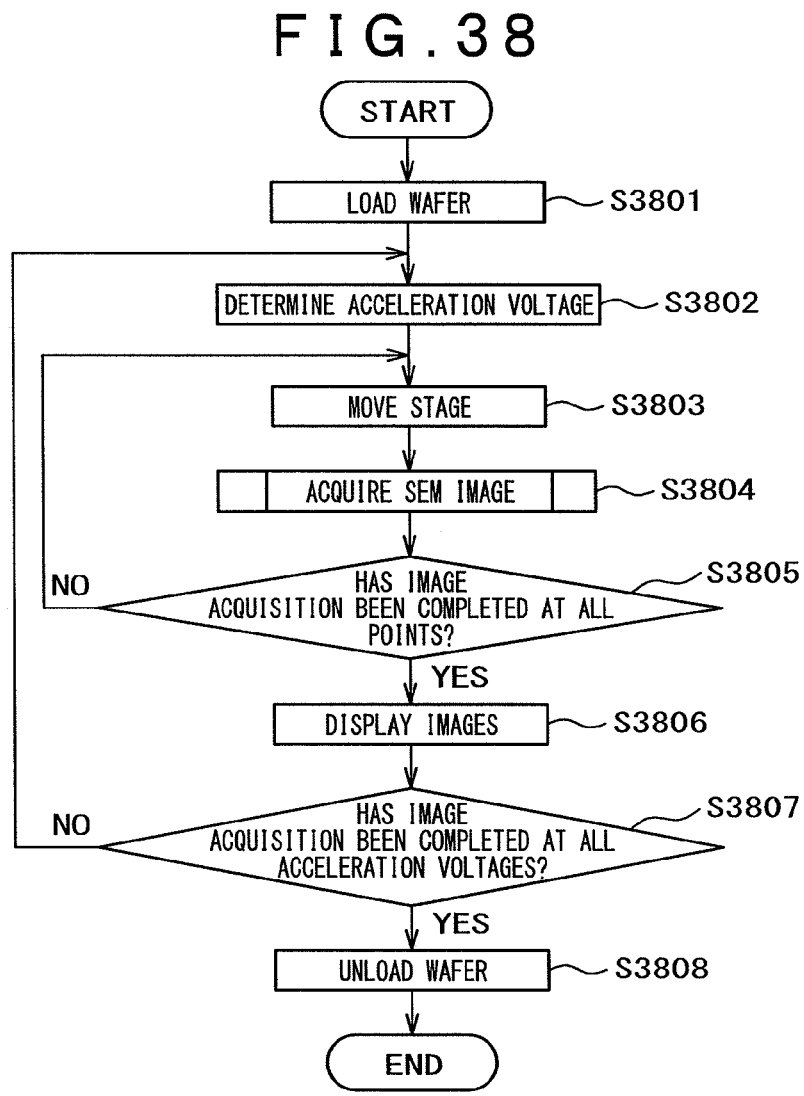
FIG. 38 is a flowchart showing processing for a single wafer, according to Embodiment 9.

In Embodiments 1 to 8, the flowchart of the processing for a single wafer, shown in FIG. 17, can be replaced with a flowchart shown in FIG. 38. In this case, image acquisition is performed at a number of measurement points at the same acceleration voltage, and the acceleration voltage is changed after image acquisition is completed at all the measurement points. With this method, the number of times the acceleration voltage is changed and the number of times the standard WD is changed accordingly are reduced, and the number of times of processing of WD adjustment is also reduced, thus improving the throughput.

Tenth Embodiment

Figure 39:
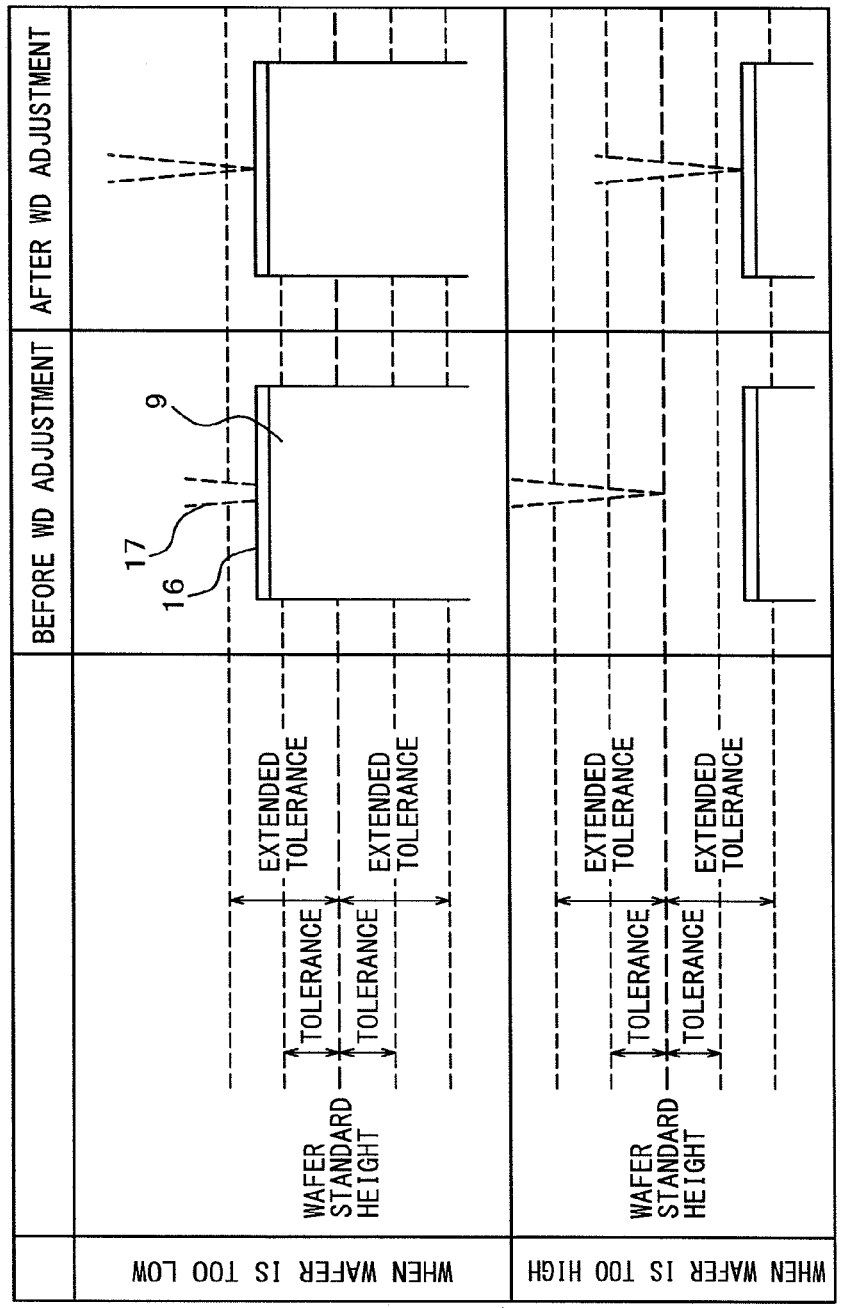
FIG. 39 is a view for explaining extended tolerances according to Embodiment 10.
Figure 40:
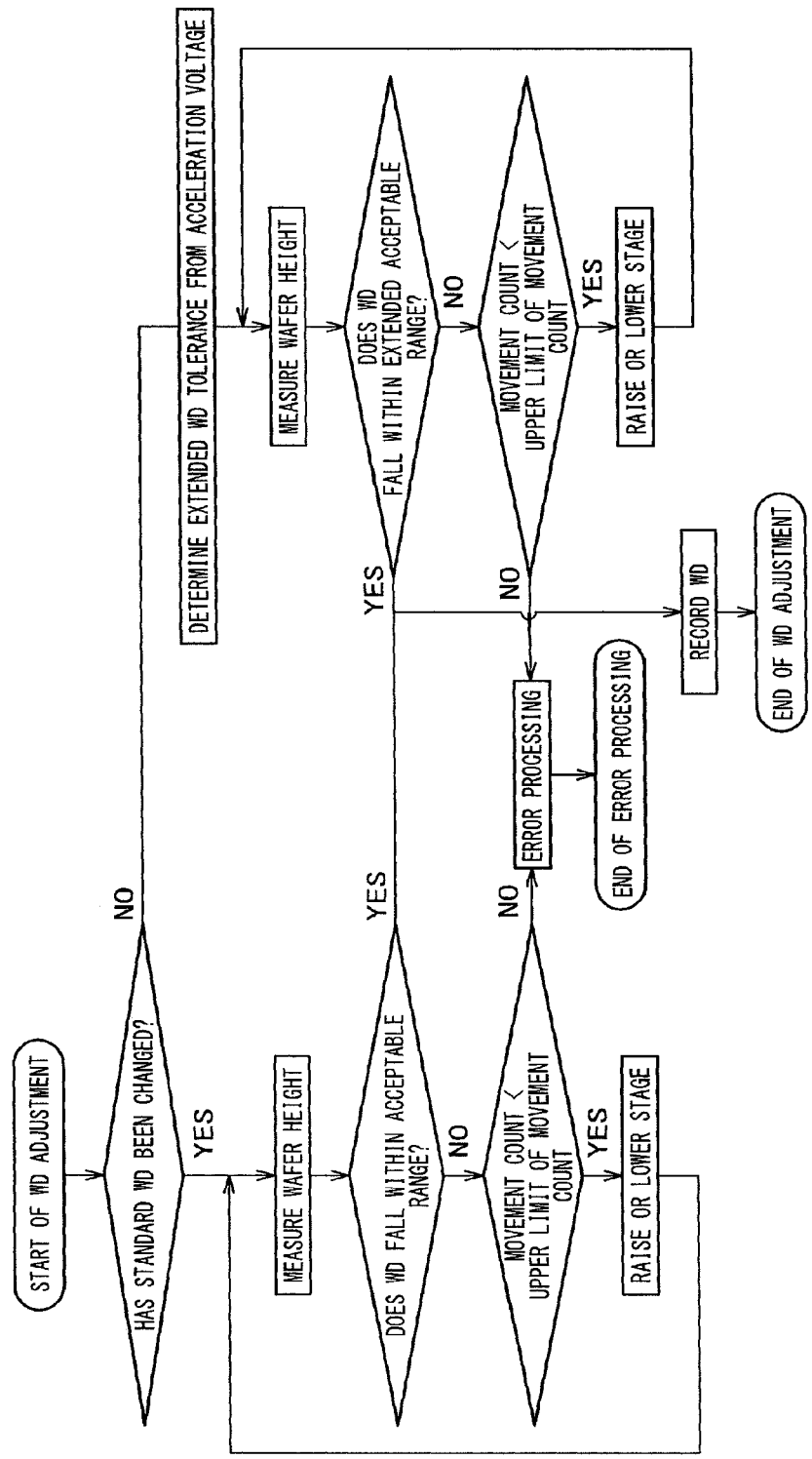
FIG. 40 is a flowchart showing WD adjustment according to Embodiment 10.

In Embodiment 9, an extended WD tolerance that is larger than the WD tolerance is set, and an extended WD acceptable range is also set, as shown in FIG. 39. Then, in an exceptional case in which the standard WD is not changed, like a case in which the wafer has been horizontally moved without changing the acceleration voltage, WD adjustment is performed by using the extended WD tolerance. By doing so, the number of times of processing of WD adjustment is further reduced, thus improving the throughput. A flowchart used in this case is shown in FIG. 40.

REFERENCE SIGNS LIST

1: electron source,
2: condenser lens,
3: aperture,
4: blanking electrode,
5: deflector,
6: boosting electrode,
7: objective lens,
8: retarding electrode,
9: stage,
10: stage lift,
11: secondary-electron detector,
12: wafer height sensor,
13: light source,
14: image processing unit,
15: controller,
16: wafer,
17: electron beam,
18: initial acceleration voltage,
19: retarding voltage,
20: boosting voltage,
21: deflection signal,
22: voltage applied to blanking electrode,
23: excitation current,
24: secondary electrons,
25: objective-lens lift,
26: light source, and
27: objective-lens height sensor.

The invention claimed is:

1. A scanning electron beam device, comprising:
an electron source;
a deflector for deflecting an electron beam emitted from the electron source;
an objective lens for converging the electron beam;
a stage configured to support a wafer on which the electron beam is radiated, wherein one selected from the stage and the objective lens can be raised and lowered;
a retarding electrode on the stage; and
a controller performs rough focus adjustment, in response to a variation in height of the wafer, using mechanical focusing that is performed by raising/lowering the stage or the objective lens,
wherein the scanning electron beam devices acquires a scanning electron image of the wafer by radiating the electron beam onto the wafer and detecting secondary electrons generated from the wafer, wherein, in a first acceleration-voltage region having a first acceleration voltage for the electron beam, the controller further performs, in addition to the rough focus adjustment, a first precise focus adjustment responding to the variation in the height of the wafer using electromagnetic focusing that is performed by adjusting an excitation current for the objective lens; and wherein, in a second acceleration-voltage region having a second acceleration voltage for the electron beam greater than the first acceleration voltage, the controller further performs, in addition to the rough focus adjustment, a second precise focus adjustment through (i) a first electrostatic focusing that is performed by adjusting a retarding voltage applied to the retarding electrode, (ii) a second electrostatic focusing that is performed by adjusting a boosting voltage applied to a boosting electrode, or (iii) a third electrostatic focusing that is performed by adjusting an initial acceleration voltage for the electron source.

2. The scanning electron beam device according to claim 1, wherein the controller automatically, by at one selected from the electromagnetic focusing, the first electrostatic focusing, the second electrostatic focusing, the third electrostatic focusing and the mechanical focusing, controls the difference between a focus height of the electron beam and a height of a surface of the wafer according to a respective one of the first and second acceleration voltages for the electron beam directed toward the wafer.

3. The scanning electron beam device according to claim 1, wherein the controller sets a working distance (WD) indicated by a distance between a surface of the wafer and a lower end of the objective lens, by raising/lowering the stage or the objective lens, according to a respective one of the first and second acceleration voltages for the electron beam directed toward the wafer.

4. The scanning electron beam device according to claim 1, further comprising:
a wafer height sensor for measuring the height of the wafer loaded on the stage.

5. The scanning electron beam device according to claim 1, further comprising:
a wafer height sensor for measuring the height of the wafer loaded on the stage; and
an objective-lens height sensor for measuring a height of the objective lens.

6. The scanning electron beam device according to claim 4, wherein
the controller has data of a standard height of the wafer according to a respective one of the first and second acceleration voltages for the electron beam directed toward the wafer;
the controller has target error data to be used to reduce an error in height between the height of the wafer measured by using the wafer height sensor and the standard height, by means of the stage which can be raised/lowered; and
the target error data has a different value according to the respective one of the first and second acceleration voltages.

7. The scanning electron beam device according to claim 4, wherein
the controller has data of a standard height of the wafer according to a respective one of the first and second acceleration voltages for the electron beam directed toward the wafer;

the controller has target error data to be used to reduce an error in height between the height of the wafer measured by using the wafer height sensor and the standard height, by means of the stage which can be raised/lowered; and a value of the target error data used for at least one high acceleration voltage is smaller than a value of tolerance data used in the first acceleration-voltage region.

8. The scanning electron beam device according to claim 4, wherein the controller has data of a standard height of the wafer according to a respective one of the first and second acceleration voltages for the electron beam directed toward the wafer;

the controller has target error data to be used to reduce an error in height between the height of the wafer measured by using the wafer height sensor and the standard height, by means of the stage which can be raised/lowered; and the controller sets a strength of an electromagnetic lens according to the error in height in the first acceleration-voltage region and a strength of an electrostatic lens according to the error in height in the second acceleration-voltage region, if the error in height is equal to or smaller than a value of the target error data.

9. The scanning electron beam device according to claim 1, further comprising:

a stopper wherein a height of the stage is adjusted based on whether the stage that has been raised/lowered is brought into contact with the stopper.

10. The scanning electron beam device according to claim 5, wherein the controller has data of a standard height of the objective lens according to a respective one of the first and second acceleration voltages for the electron beam directed toward the wafer;

the controller has target error data to be used to reduce an error in height between the height of the wafer measured by using the wafer height sensor and the standard height, by means of the stage which can be raised/lowered; and the controller sets a strength of an electromagnetic lens according to the error in height in the first acceleration-voltage region and a strength of an electrostatic lens according to the error in height in the second acceleration-voltage region, if the error in height is equal to or smaller than a value of the target error data.

11. A dimension measurement method using a scanning electron beam device that includes an electron source, a deflector for deflecting an electron beam emitted from the electron source, an objective lens for converging the electron beam, a retarding electrode, a stage on which a wafer is loaded, and a controller, and that acquires a scanning electron image of the wafer by radiating the electron beam onto the wafer while changing an acceleration voltage, and detecting secondary electrons generated from the wafer, the method comprising the steps of:

acquiring, when a first acceleration electron beam having a first acceleration voltage is used to measure upper portions of a hole and a groove on the wafer, a first image after shortening a working distance (WD) indicated by the distance between a surface of the wafer and a lower end of the objective lens;

acquiring, when a second acceleration electron beam having a second acceleration voltage greater than the first acceleration voltage is used to measure bottom portions of the hole and the groove on the wafer, a second image after performing rough focus adjustment responding to a variation in the height of the wafer, through mechanical focusing for adjusting the working distance (WD) by raising/lowering the stage or the objective lens; and measuring dimensions of the upper portions and the bottom portions of the hole and the groove on the wafer, from the first and second images, wherein, when the first acceleration electron beam is used to measure the upper portions of the hole and the groove on the wafer, a first precise focus adjustment responding to the variation in the height of the wafer is performed, in addition to the rough focus adjustment, using electromagnetic focusing that is performed by adjusting an excitation current for the objective lens, and wherein, when the second acceleration electron beam is used to measure the bottom portions of the hole and the groove on the wafer, a second precise focus adjustment responding to the variation in the height of the wafer is performed, in addition to the rough focus adjustment, through (i) a first electrostatic focusing that is performed by adjusting a retarding voltage applied to the retarding electrode, (ii) a second electrostatic focusing that is performed by adjusting a boosting voltage applied to a boosting electrode, or (iii) a third electrostatic focusing that is performed by adjusting an initial acceleration voltage for the electron source.

12. The dimension measurement method using the scanning electron beam device, according to claim 11, wherein, when the second acceleration electron beam is used to measure the bottom portions of the hole and the groove on the wafer, the working distance (WD) is extended by raising/lowering the stage, on which the wafer is loaded, or the objective lens, and an image is acquired using an excitation current with which an excitation coil of the objective lens is not magnetically saturated.

* * * * *